US012061305B2

(12) United States Patent
Fox et al.

(10) Patent No.: US 12,061,305 B2
(45) Date of Patent: *Aug. 13, 2024

(54) FIELD OPERATIONS NEURAL NETWORK HEURISTICS

(71) Applicant: Schlumberger Technology Corporation, Sugar Land, TX (US)

(72) Inventors: Maria Fox, Cambridge (GB); Derek Long, Cambridge (GB); Fangkai Yang, Sugar Land, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/347,597

(22) Filed: Jul. 6, 2023

(65) Prior Publication Data

US 2023/0341585 A1    Oct. 26, 2023

Related U.S. Application Data

(63) Continuation of application No. 16/466,034, filed as application No. PCT/US2017/064801 on Dec. 6, 2017, now Pat. No. 11,740,384.

(Continued)

(51) Int. Cl.
| | | |
|---|---|---|
| *G06F 16/00* | (2019.01) | |
| *G01V 1/28* | (2006.01) | |
| *G01V 3/38* | (2006.01) | |
| *G01V 11/00* | (2006.01) | |
| *G01V 20/00* | (2024.01) | |
| *G06F 18/214* | (2023.01) | |
| *G06N 3/045* | (2023.01) | |

(Continued)

(52) U.S. Cl.
CPC ............ *G01V 11/002* (2013.01); *G01V 1/282* (2013.01); *G01V 3/38* (2013.01); *G01V 20/00* (2024.01); *G06F 18/214* (2023.01); *G06N 3/045* (2023.01); *G06N 3/08* (2013.01); *G06F 30/20* (2020.01)

(58) Field of Classification Search
None
See application file for complete search history.

(56) References Cited

U.S. PATENT DOCUMENTS

| | | |
|---|---|---|
| 6,549,879 B1 | 4/2003 | Cullick et al. |
| 11,740,384 B2 | 8/2023 | Fox et al. |

(Continued)

OTHER PUBLICATIONS

Ciresan, et al., "Multi-column Deep Neural Networks for Image Classification," CVPR "12 Proceedings of the 2012 IEEE Conference on Computer Vision and Pattern Recognition.

(Continued)

*Primary Examiner* — Anhtai V Tran
(74) *Attorney, Agent, or Firm* — Aashish Y. Chawla

(57) ABSTRACT

A system and method that include receiving an oilfield operational plan and converting the oilfield operational plan into pixel-grids that are interpreted as images. The system and method also include inputting the pixel-grids to an image analysis convolution neural network to execute an image interpretation process. The system and method additionally include determining a current state of the oilfield operational plan based on the image interpretation process. The system and method further include determining a next state of the oilfield operational plan.

20 Claims, 16 Drawing Sheets

Related U.S. Application Data

(60) Provisional application No. 62/431,853, filed on Dec. 9, 2016.

(51) Int. Cl.
  G06N 3/08 (2023.01)
  G06F 30/20 (2020.01)

(56) References Cited

U.S. PATENT DOCUMENTS

| | | | | |
|---|---|---|---|---|
| 2008/0262810 A1* | 10/2008 | Moran | ....................... | E21B 7/00 |
| | | | | 703/10 |
| 2009/0020284 A1 | 1/2009 | Graf et al. | | |
| 2018/0121762 A1* | 5/2018 | Han | ..................... | G06V 10/462 |
| 2018/0329113 A1* | 11/2018 | Walters | .................. | E21B 49/08 |

OTHER PUBLICATIONS

Garrett, et al., "Learning to Rank for Synthesizing Planning Heuristics," Proceedings of 25th International Joint Conference of Artificial Intelligence (IJCAI), 2016.

Silver, et al, "Mastering the Game of Go with Deep Neural Networks and Tree Search," Nature, vol. 529, Jan. 28, 2016, p. 484-489.

Yoon, et al., "Learning heuristic functions from relaxed plans", Proceedings of the Sixteenth International Conference on International Conference on Automated Planning and Scheduling, 2006 AAAI Press pp. 162-170.

International Preliminary Report on Patentability issued in the PCT Application No. PCT/US2017/064801, dated Jun. 20, 2019.

International Search Report and Written Opinion issued in the PCT Application No. PCT/US2017/064801, dated Feb. 14, 2018.

* cited by examiner

Image 1200

FIELD OPERATIONS NEURAL NETWORK HEURISTICS

RELATED APPLICATIONS

This application is a continuation of, and claims priority to, U.S. application Ser. No. 16/466,034, filed 3 Jun. 2019, now published as US 2019/0302310, which was the National State of International Application No. PCT/US2017/064801 filed on 6 Dec. 2017, which claims priority to and the benefit of a US Provisional Application having Ser. No. 62/431,853, filed 9 Dec. 2016, which is incorporated by reference herein.

BACKGROUND

A resource field can be an accumulation, pool or group of pools of one or more resources (e.g., oil, gas, oil and gas) in a subsurface environment. A resource field can include at least one reservoir. A reservoir may be shaped in a manner that can trap hydrocarbons and may be covered by an impermeable or sealing rock. A bore can be drilled into an environment where the bore may be utilized to form a well that can be utilized in producing hydrocarbons from a reservoir.

A rig can be a system of components that can be operated to form a bore in an environment, to transport equipment into and out of a bore in an environment, etc. As an example, a rig can include a system that can be used to drill a bore and to acquire information about an environment, about drilling, etc. A resource field may be an onshore field, an offshore field or an on- and offshore field. A rig can include components for performing operations onshore and/or offshore. A rig may be, for example, vessel-based, offshore platform-based, onshore, etc.

Field planning can occur over one or more phases, which can include an exploration phase that aims to identify and assess an environment (e.g., a prospect, a play, etc.), which may include drilling of one or more bores (e.g., one or more exploratory wells, etc.). Other phases can include appraisal, development and production phases.

SUMMARY

A method may include receiving an oilfield operational plan and converting the oilfield operational plan into pixel-grids that are interpreted as images. The method may additionally include inputting the pixel-grids to an image analysis convolution neural network to execute an image interpretation process. The method may also include determining a current state of the oilfield operational plan based on the image interpretation process. The method may further include determining a next state of the oilfield operational plan, where the next state is a desirable state that is achievable via at least one action. At least one control signal is outputted to oilfield equipment to execute the at least one action to achieve the next state.

A system may include a processor; memory accessible by the processor; processor-executable instructions stored in the memory and executable to instruct the system to receive an oilfield operational plan and convert the oilfield operational plan into pixel-grids that are interpreted as images. The instructions may also instruct the system to input the pixel-grids to an image analysis convolution neural network to execute an image interpretation process. The instructions may additionally instruct the system to determine a current state of the oilfield operational plan based on the image interpretation process. The instructions may further instruct the system to determine a next state of the oilfield operational plan, where the next state is a desirable state that is achievable via at least one action. At least one control signal is outputted to oilfield equipment to execute the at least one action to achieve the next state.

A non-transitory computer-readable storage medium storing instructions that when executed by a computer, which includes a processor performs a method, the method may include receiving an oilfield operational plan and converting the oilfield operational plan into pixel-grids that are interpreted as images. The method may additionally include inputting the pixel-grids to an image analysis convolution neural network to execute an image interpretation process. The method may also include determining a current state of the oilfield operational plan based on the image interpretation process. The method may further include determining a next state of the oilfield operational plan, where the next state is a desirable state that is achievable via at least one action. At least one control signal is outputted to oilfield equipment to execute the at least one action to achieve the next state.

Various other apparatuses, systems, methods, etc., are also disclosed.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

DETAILED DESCRIPTION

The following description includes the best mode presently contemplated for practicing the described implementations. This description is not to be taken in a limiting sense, but rather is made merely for the purpose of describing the general principles of the implementations. The scope of the described implementations should be ascertained with reference to the issued claims.

Figure 1:
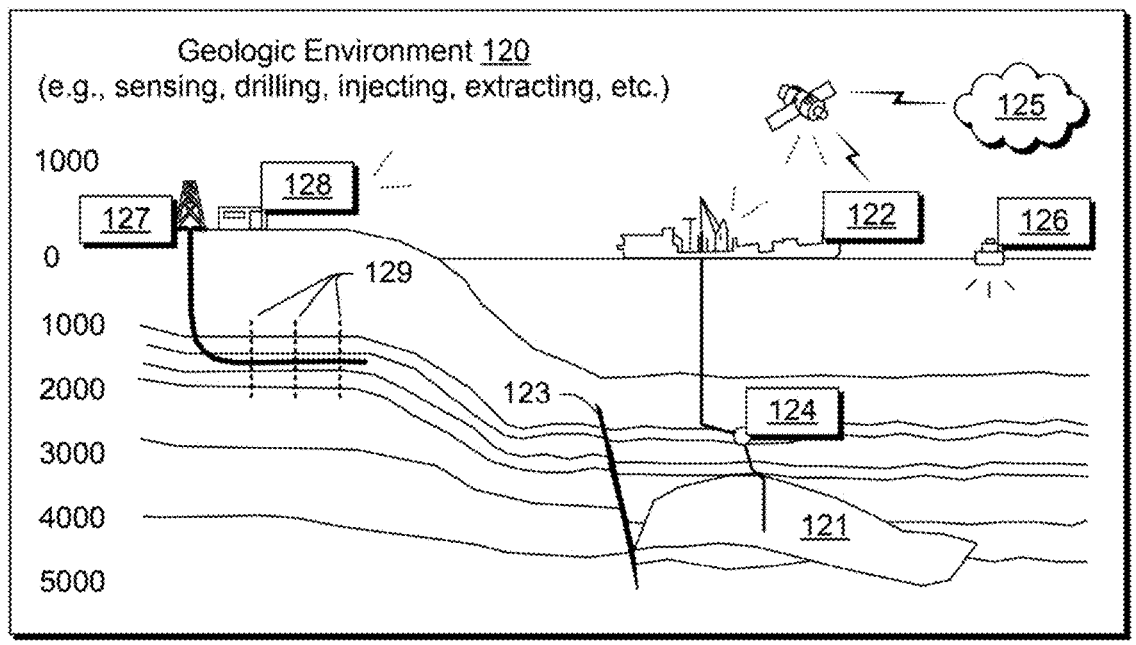
FIG. 1 illustrates examples of equipment in a geologic environment.
Figure 1:
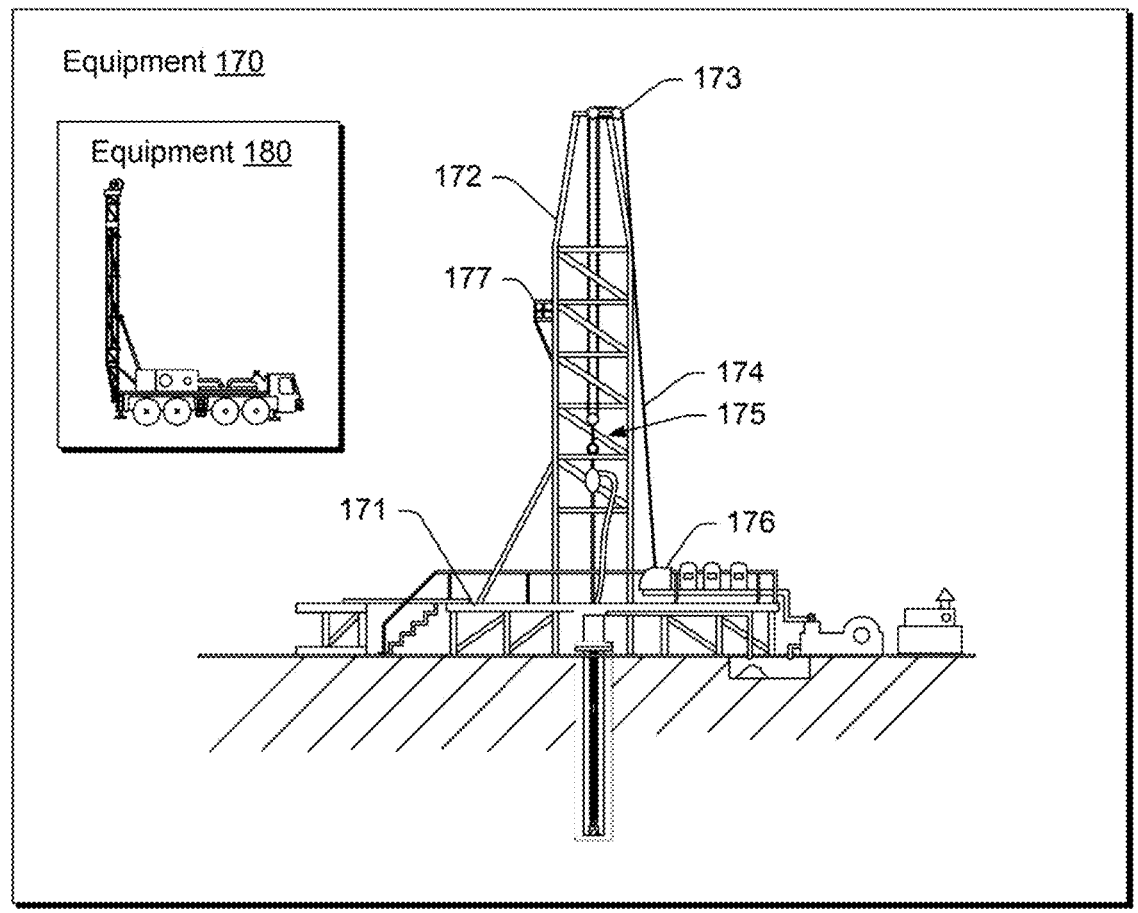

FIG. 1 shows an example of a geologic environment 120. In FIG. 1, the geologic environment 120 may be a sedimentary basin that includes layers (e.g., stratification) that include a reservoir 121 and that may be, for example, intersected by a fault 123 (e.g., or faults). As an example, the geologic environment 120 may be outfitted with any of a variety of sensors, detectors, actuators, etc. For example, equipment 122 may include communication circuitry to receive and to transmit information with respect to one or more networks 125. Such information may include information associated with downhole equipment 124, which may be equipment to acquire information, to assist with resource recovery, etc. Other equipment 126 may be located remote from a well site and include sensing, detecting, emitting or other circuitry. Such equipment may include storage and communication circuitry to store and to communicate data, instructions, etc. As an example, one or more pieces of equipment may provide for measurement, collection, communication, storage, analysis, etc. of data (e.g., for one or more produced resources, etc.). As an example, one or more satellites may be provided for purposes of communications, data acquisition, etc. For example, FIG. 1 shows a satellite in communication with the network 125 that may be configured for communications, noting that the satellite may additionally or alternatively include circuitry for imagery (e.g., spatial, spectral, temporal, radiometric, etc.).

FIG. 1 also shows the geologic environment 120 as optionally including equipment 127 and 128 associated with a well that includes a substantially horizontal portion that may intersect with one or more fractures 129. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop the reservoir (e.g., via fracturing, injecting, extracting, etc.). As an example, the equipment 127 and/or 128 may include components, a system, systems, etc. for fracturing, seismic sensing, analysis of seismic data, assessment of one or more fractures, injection, production, etc. As an example, the equipment 127 and/or 128 may provide for measurement, collection, communication, storage, analysis, etc. of data such as, for example, production data (e.g., for one or more produced resources). As an example, one or more satellites may be provided for purposes of communications, data acquisition, etc.

FIG. 1 also shows an example of equipment 170 and an example of equipment 180. Such equipment, which may be systems of components, may be suitable for use in the geologic environment 120. While the equipment 170 and 180 are illustrated as land-based, various components may be suitable for use in an offshore system.

The equipment 170 includes a platform 171, a derrick 172, a crown block 173, a line 174, a traveling block assembly 175, drawworks 176 and a landing 177 (e.g., a monkeyboard). As an example, the line 174 may be controlled at least in part via the drawworks 176 such that the traveling block assembly 175 travels in a vertical direction with respect to the platform 171. For example, by drawing the line 174 in, the drawworks 176 may cause the line 174 to run through the crown block 173 and lift the traveling block assembly 175 skyward away from the platform 171; whereas, by allowing the line 174 out, the drawworks 176 may cause the line 174 to run through the crown block 173 and lower the traveling block assembly 175 toward the platform 171. Where the traveling block assembly 175 carries pipe (e.g., casing, etc.), tracking of movement of the traveling block 175 may provide an indication as to how much pipe has been deployed.

A derrick can be a structure used to support a crown block and a traveling block operatively coupled to the crown block at least in part via line. A derrick may be pyramidal in shape and offer a suitable strength-to-weight ratio. A derrick may be movable as a unit or in a piece by piece manner (e.g., to be assembled and disassembled).

As an example, drawworks may include a spool, brakes, a power source and assorted auxiliary devices. Drawworks may controllably reel out and reel in line. Line may be reeled over a crown block and coupled to a traveling block to gain mechanical advantage in a "block and tackle" or "pulley" fashion. Reeling out and in of line can cause a traveling block (e.g., and whatever may be hanging underneath it), to be lowered into or raised out of a bore. Reeling out of line may be powered by gravity and reeling in by a motor, an engine, etc. (e.g., an electric motor, a diesel engine, etc.).

As an example, a crown block can include a set of pulleys (e.g., sheaves) that can be located at or near a top of a derrick or a mast, over which line is threaded. A traveling block can include a set of sheaves that can be moved up and down in a derrick or a mast via line threaded in the set of sheaves of the traveling block and in the set of sheaves of a crown block. A crown block, a traveling block and a line can form a pulley system of a derrick or a mast, which may enable handling of heavy loads (e.g., drillstring, pipe, casing, liners, etc.) to be lifted out of or lowered into a bore. As an example, line may be about a centimeter to about five centimeters in diameter as, for example, steel cable. Through use of a set of sheaves, such line may carry loads heavier than the line could support as a single strand.

As an example, a derrickman may be a rig crew member that works on a platform attached to a derrick or a mast. A derrick can include a landing on which a derrickman may stand. As an example, such a landing may be about 10 meters or more above a rig floor. In an operation referred to as trip out of the hole (TOH), a derrickman may wear a safety harness than enables leaning out from the work landing (e.g., monkeyboard) to reach pipe in located at or near the center of a derrick or a mast and to throw a line around the pipe and pull it back into its storage location (e.g., fingerboards), for example, until it a time at which it may be desirable to run the pipe back into the bore. As an example, a rig may include automated pipe-handling equipment such that the derrickman controls the machinery rather than physically handling the pipe.

As an example, a trip may refer to the act of pulling equipment from a bore and/or placing equipment in a bore. As an example, equipment may include a drillstring that can be pulled out of a hole and/or placed or replaced in a hole. As an example, a pipe trip may be performed where a drill bit has dulled or has otherwise ceased to drill efficiently and is to be replaced.

Figure 2:
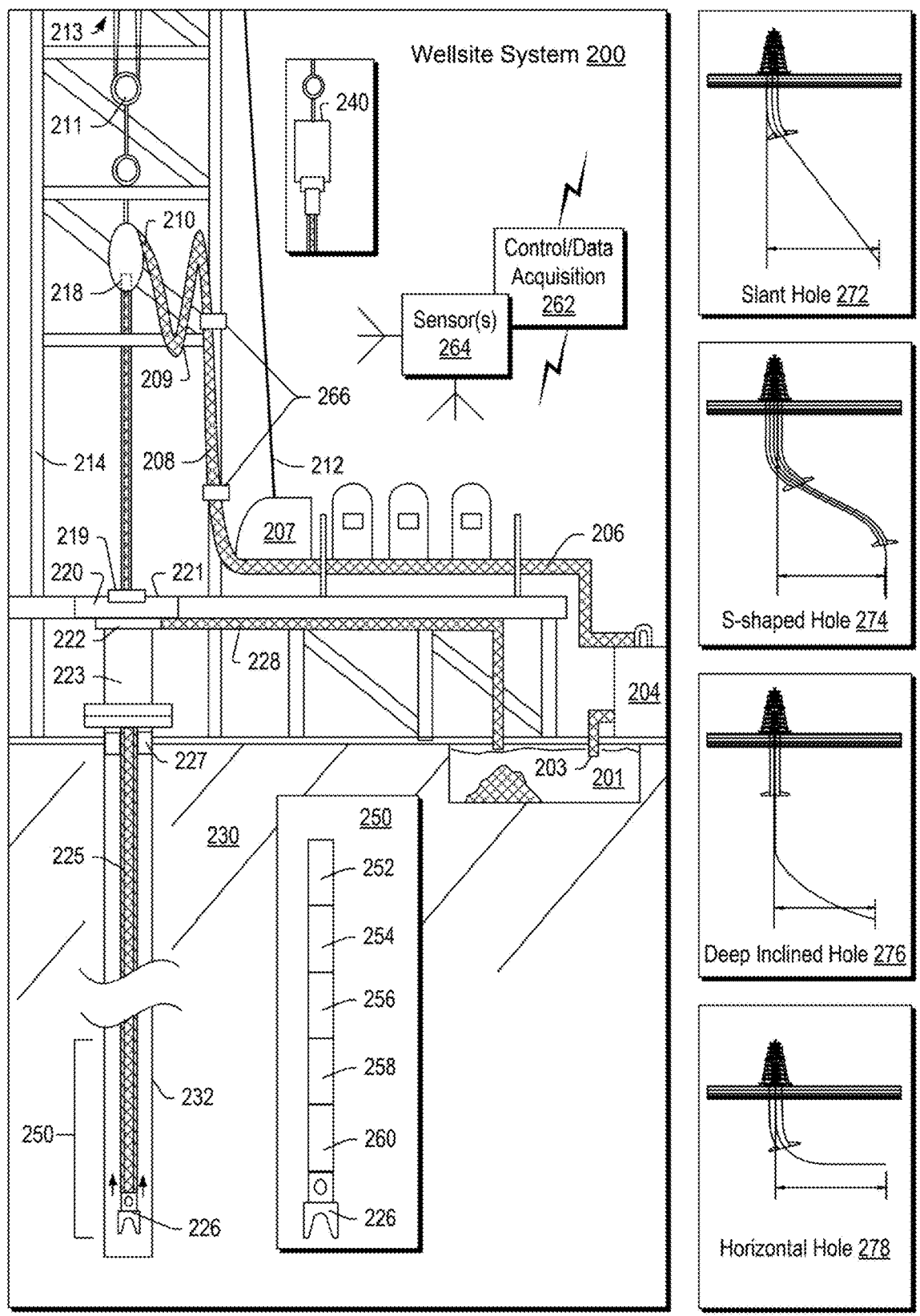
FIG. 2 illustrates examples of equipment and examples of hole types.

FIG. 2 shows an example of a wellsite system 200 (e.g., at a wellsite that may be onshore or offshore). As shown, the wellsite system 200 can include a mud tank 201 for holding mud and other material (e.g., where mud can be a drilling fluid), a suction line 203 that serves as an inlet to a mud pump 204 for pumping mud from the mud tank 201 such that mud flows to a vibrating hose 206, a drawworks 207 for winching drill line or drill lines 212, a standpipe 208 that receives mud from the vibrating hose 206, a kelly hose 209 that receives mud from the standpipe 208, a gooseneck or goosenecks 210, a traveling block 211, a crown block 213 for carrying the traveling block 211 via the drill line or drill lines 212 (see, e.g., the crown block 173 of FIG. 1), a derrick 214 (see, e.g., the derrick 172 of FIG. 1), a kelly 218 or a top drive 240, a kelly drive bushing 219, a rotary table 220, a drill floor 221, a bell nipple 222, one or more blowout preventors (BOPs) 223, a drillstring 225, a drill bit 226, a casing head 227 and a flow pipe 228 that carries mud and other material to, for example, the mud tank 201.

In the example system of FIG. 2, a borehole 232 is formed in subsurface formations 230 by rotary drilling; noting that various example embodiments may also use directional drilling.

As shown in the example of FIG. 2, the drillstring 225 is suspended within the borehole 232 and has a drillstring assembly 250 that includes the drill bit 226 at its lower end. As an example, the drillstring assembly 250 may be a bottom hole assembly (BHA).

The wellsite system 200 can provide for operation of the drillstring 225 and other operations. As shown, the wellsite system 200 includes the platform 211 and the derrick 214 positioned over the borehole 232. As mentioned, the wellsite system 200 can include the rotary table 220 where the drillstring 225 pass through an opening in the rotary table 220.

As shown in the example of FIG. 2, the wellsite system 200 can include the kelly 218 and associated components, etc., or a top drive 240 and associated components. As to a kelly example, the kelly 218 may be a square or hexagonal metal/alloy bar with a hole drilled therein that serves as a mud flow path. The kelly 218 can be used to transmit rotary motion from the rotary table 220 via the kelly drive bushing 219 to the drillstring 225, while allowing the drillstring 225 to be lowered or raised during rotation. The kelly 218 can pass through the kelly drive bushing 219, which can be driven by the rotary table 220. As an example, the rotary table 220 can include a master bushing that operatively couples to the kelly drive bushing 219 such that rotation of the rotary table 220 can turn the kelly drive bushing 219 and hence the kelly 218. The kelly drive bushing 219 can include an inside profile matching an outside profile (e.g., square, hexagonal, etc.) of the kelly 218; however, with slightly larger dimensions so that the kelly 218 can freely move up and down inside the kelly drive bushing 219.

As to a top drive example, the top drive 240 can provide functions performed by a kelly and a rotary table. The top drive 240 can turn the drillstring 225. As an example, the top drive 240 can include one or more motors (e.g., electric and/or hydraulic) connected with appropriate gearing to a short section of pipe called a quill, that in turn may be screwed into a saver sub or the drillstring 225 itself. The top drive 240 can be suspended from the traveling block 211, so the rotary mechanism is free to travel up and down the derrick 214. As an example, a top drive 240 may allow for drilling to be performed with more joint stands than a kelly/rotary table approach.

In the example of FIG. 2, the mud tank 201 can hold mud, which can be one or more types of drilling fluids. As an example, a wellbore may be drilled to produce fluid, inject fluid or both (e.g., hydrocarbons, minerals, water, etc.).

In the example of FIG. 2, the drillstring 225 (e.g., including one or more downhole tools) may be composed of a series of pipes threadably connected together to form a long tube with the drill bit 226 at the lower end thereof. As the drillstring 225 is advanced into a wellbore for drilling, at some point in time prior to or coincident with drilling, the mud may be pumped by the pump 204 from the mud tank 201 (e.g., or other source) via a the lines 206, 208 and 209 to a port of the kelly 218 or, for example, to a port of the top drive 240. The mud can then flow via a passage (e.g., or passages) in the drillstring 225 and out of ports located on the drill bit 226 (see, e.g., a directional arrow). As the mud exits the drillstring 225 via ports in the drill bit 226, it can then circulate upwardly through an annular region between an outer surface(s) of the drillstring 225 and surrounding wall(s) (e.g., open borehole, casing, etc.), as indicated by directional arrows. In such a manner, the mud lubricates the drill bit 226 and carries heat energy (e.g., frictional or other energy) and formation cuttings to the surface where the mud (e.g., and cuttings) may be returned to the mud tank 201, for example, for recirculation (e.g., with processing to remove cuttings, etc.).

The mud pumped by the pump 204 into the drillstring 225 may, after exiting the drillstring 225, form a mudcake that lines the wellbore which, among other functions, may reduce friction between the drillstring 225 and surrounding wall(s) (e.g., borehole, casing, etc.). A reduction in friction may facilitate advancing or retracting the drillstring 225. During a drilling operation, the entire drill string 225 may be pulled from a wellbore and optionally replaced, for example, with a new or sharpened drill bit, a smaller diameter drill string, etc. As mentioned, the act of pulling a drill string out of a hole or replacing it in a hole is referred to as tripping. A trip may be referred to as an upward trip or an outward trip or as a downward trip or an inward trip depending on trip direction.

As an example, consider a downward trip where upon arrival of the drill bit 226 of the drill string 225 at a bottom of a wellbore, pumping of the mud commences to lubricate the drill bit 226 for purposes of drilling to enlarge the wellbore. As mentioned, the mud can be pumped by the pump 204 into a passage of the drillstring 225 and, upon filling of the passage, the mud may be used as a transmission medium to transmit energy, for example, energy that may encode information as in mud-pulse telemetry.

As an example, mud-pulse telemetry equipment may include a downhole device configured to effect changes in pressure in the mud to create an acoustic wave or waves upon which information may modulated. In such an example, information from downhole equipment (e.g., one or more modules of the drillstring 225) may be transmitted uphole to an uphole device, which may relay such information to other equipment for processing, control, etc.

As an example, telemetry equipment may operate via transmission of energy via the drillstring 225 itself. For example, consider a signal generator that imparts coded energy signals to the drillstring 225 and repeaters that may receive such energy and repeat it to further transmit the coded energy signals (e.g., information, etc.).

As an example, the drillstring 225 may be fitted with telemetry equipment 252 that includes a rotatable drive shaft, a turbine impeller mechanically coupled to the drive shaft such that the mud can cause the turbine impeller to rotate, a modulator rotor mechanically coupled to the drive shaft such that rotation of the turbine impeller causes said modulator rotor to rotate, a modulator stator mounted adjacent to or proximate to the modulator rotor such that rotation of the modulator rotor relative to the modulator stator creates pressure pulses in the mud, and a controllable brake for selectively braking rotation of the modulator rotor to modulate pressure pulses. In such example, an alternator may be coupled to the aforementioned drive shaft where the alternator includes at least one stator winding electrically coupled to a control circuit to selectively short the at least one stator winding to electromagnetically brake the alternator and thereby selectively brake rotation of the modulator rotor to modulate the pressure pulses in the mud.

In the example of FIG. 2, an uphole control and/or data acquisition system 262 may include circuitry to sense pressure pulses generated by telemetry equipment 252 and, for example, communicate sensed pressure pulses or information derived therefrom for process, control, etc.

The assembly 250 of the illustrated example includes a logging-while-drilling (LWD) module 254, a measuring-while-drilling (MWD) module 256, an optional module 258, a roto-steerable system and motor 260, and the drill bit 226. Such components or modules may be referred to as tools where a drillstring can include a plurality of tools.

The LWD module 254 may be housed in a suitable type of drill collar and can contain one or a plurality of selected types of logging tools. It will also be understood that more than one LWD and/or MWD module can be employed, for example, as represented at by the module 256 of the drillstring assembly 250. Where the position of an LWD module is mentioned, as an example, it may refer to a module at the position of the LWD module 254, the module 256, etc. An LWD module can include capabilities for measuring, processing, and storing information, as well as for communicating with the surface equipment. In the illustrated example, the LWD module 254 may include a seismic measuring device.

The MWD module 256 may be housed in a suitable type of drill collar and can contain one or more devices for measuring characteristics of the drillstring 225 and the drill bit 226. As an example, the MWD tool 254 may include equipment for generating electrical power, for example, to power various components of the drillstring 225. As an example, the MWD tool 254 may include the telemetry equipment 252, for example, where the turbine impeller can generate power by flow of the mud; it being understood that other power and/or battery systems may be employed for purposes of powering various components. As an example, the MWD module 256 may include one or more of the following types of measuring devices: a weight-on-bit measuring device, a torque measuring device, a vibration measuring device, a shock measuring device, a stick slip measuring device, a direction measuring device, and an inclination measuring device.

FIG. 2 also shows some examples of types of holes that may be drilled. For example, consider a slant hole 272, an S-shaped hole 274, a deep inclined hole 276 and a horizontal hole 278.

As an example, a drilling operation can include directional drilling where, for example, at least a portion of a well includes a curved axis. For example, consider a radius that defines curvature where an inclination with regard to the vertical may vary until reaching an angle between about 30 degrees and about 60 degrees or, for example, an angle to about 90 degrees or possibly greater than about 90 degrees.

As an example, a directional well can include several shapes where each of the shapes may aim to meet particular operational demands. As an example, a drilling process may be performed on the basis of information as and when it is relayed to a drilling engineer. As an example, inclination and/or direction may be modified based on information received during a drilling process.

As an example, deviation of a bore may be accomplished in part by use of a downhole motor and/or a turbine. As to a motor, for example, a drillstring can include a positive displacement motor (PDM).

As an example, a system may be a steerable system and include equipment to perform a method such as geosteering. As an example, a steerable system can include a PDM or a turbine on a lower part of a drillstring which, just above a drill bit, a bent sub can be mounted. As an example, above a PDM, MWD equipment that provides real time or near real time data of interest (e.g., inclination, direction, pressure, temperature, real weight on the drill bit, torque stress, etc.) and/or LWD equipment may be installed. As to the latter, LWD equipment can make it possible to send to the surface various types of data of interest, including for example, geological data (e.g., gamma ray log, resistivity, density and sonic logs, etc.).

The coupling of sensors providing information on the course of a well trajectory, in real time or near real time, with, for example, one or more logs characterizing the formations from a geological viewpoint, can allow for implementing a geosteering method. Such a method can include navigating a subsurface environment, for example, to follow a desired route to reach a desired target or targets.

As an example, a drillstring can include an azimuthal density neutron (ADN) tool for measuring density and porosity; a MWD tool for measuring inclination, azimuth and shocks; a compensated dual resistivity (CDR) tool for measuring resistivity and gamma ray related phenomena; one or more variable gauge stabilizers; one or more bend joints; and a geosteering tool, which may include a motor and optionally equipment for measuring and/or responding to one or more of inclination, resistivity and gamma ray related phenomena.

As an example, geosteering can include intentional directional control of a wellbore based on results of downhole geological logging measurements in a manner that aims to keep a directional wellbore within a desired region, zone (e.g., a pay zone), etc. As an example, geosteering may include directing a wellbore to keep the wellbore in a particular section of a reservoir, for example, to minimize gas and/or water breakthrough and, for example, to maximize economic production from a well that includes the wellbore.

Referring again to FIG. 2, the wellsite system 200 can include one or more sensors 264 that are operatively coupled to the control and/or data acquisition system 262. As an example, a sensor or sensors may be at surface locations. As an example, a sensor or sensors may be at downhole locations. As an example, a sensor or sensors may be at one or more remote locations that are not within a distance of the order of about one hundred meters from the wellsite system 200. As an example, a sensor or sensor may be at an offset wellsite where the wellsite system 200 and the offset wellsite are in a common field (e.g., oil and/or gas field).

As an example, one or more of the sensors 264 can be provided for tracking pipe, tracking movement of at least a portion of a drillstring, etc.

As an example, the system 200 can include one or more sensors 266 that can sense and/or transmit signals to a fluid conduit such as a drilling fluid conduit (e.g., a drilling mud conduit). For example, in the system 200, the one or more sensors 266 can be operatively coupled to portions of the standpipe 208 through which mud flows. As an example, a downhole tool can generate pulses that can travel through the mud and be sensed by one or more of the one or more sensors 266. In such an example, the downhole tool can include associated circuitry such as, for example, encoding circuitry that can encode signals, for example, to reduce demands as to transmission. As an example, circuitry at the surface may include decoding circuitry to decode encoded information transmitted at least in part via mud-pulse telemetry. As an example, circuitry at the surface may include encoder circuitry and/or decoder circuitry and circuitry downhole may include encoder circuitry and/or decoder circuitry. As an example, the system 200 can include a transmitter that can generate signals that can be transmitted downhole via mud (e.g., drilling fluid) as a transmission medium.

As an example, one or more portions of a drillstring may become stuck. The term stuck can refer to one or more of varying degrees of inability to move or remove a drillstring from a bore. As an example, in a stuck condition, it might be possible to rotate pipe or lower it back into a bore or, for example, in a stuck condition, there may be an inability to move the drillstring axially in the bore, though some amount of rotation may be possible. As an example, in a stuck condition, there may be an inability to move at least a portion of the drillstring axially and rotationally.

As to the term "stuck pipe", this can refer to a portion of a drillstring that cannot be rotated or moved axially. As an example, a condition referred to as "differential sticking" can be a condition whereby the drillstring cannot be moved (e.g., rotated or reciprocated) along the axis of the bore. Differential sticking may occur when high-contact forces caused by low reservoir pressures, high wellbore pressures, or both, are exerted over a sufficiently large area of the drillstring. Differential sticking can have time and financial cost.

As an example, a sticking force can be a product of the differential pressure between the wellbore and the reservoir and the area that the differential pressure is acting upon. This means that a relatively low differential pressure (delta p) applied over a large working area can be just as effective in sticking pipe as can a high differential pressure applied over a small area.

As an example, a condition referred to as "mechanical sticking" can be a condition where limiting or prevention of motion of the drillstring by a mechanism other than differential pressure sticking occurs. Mechanical sticking can be caused, for example, by one or more of junk in the hole, wellbore geometry anomalies, cement, keyseats or a buildup of cuttings in the annulus.

Figure 3:
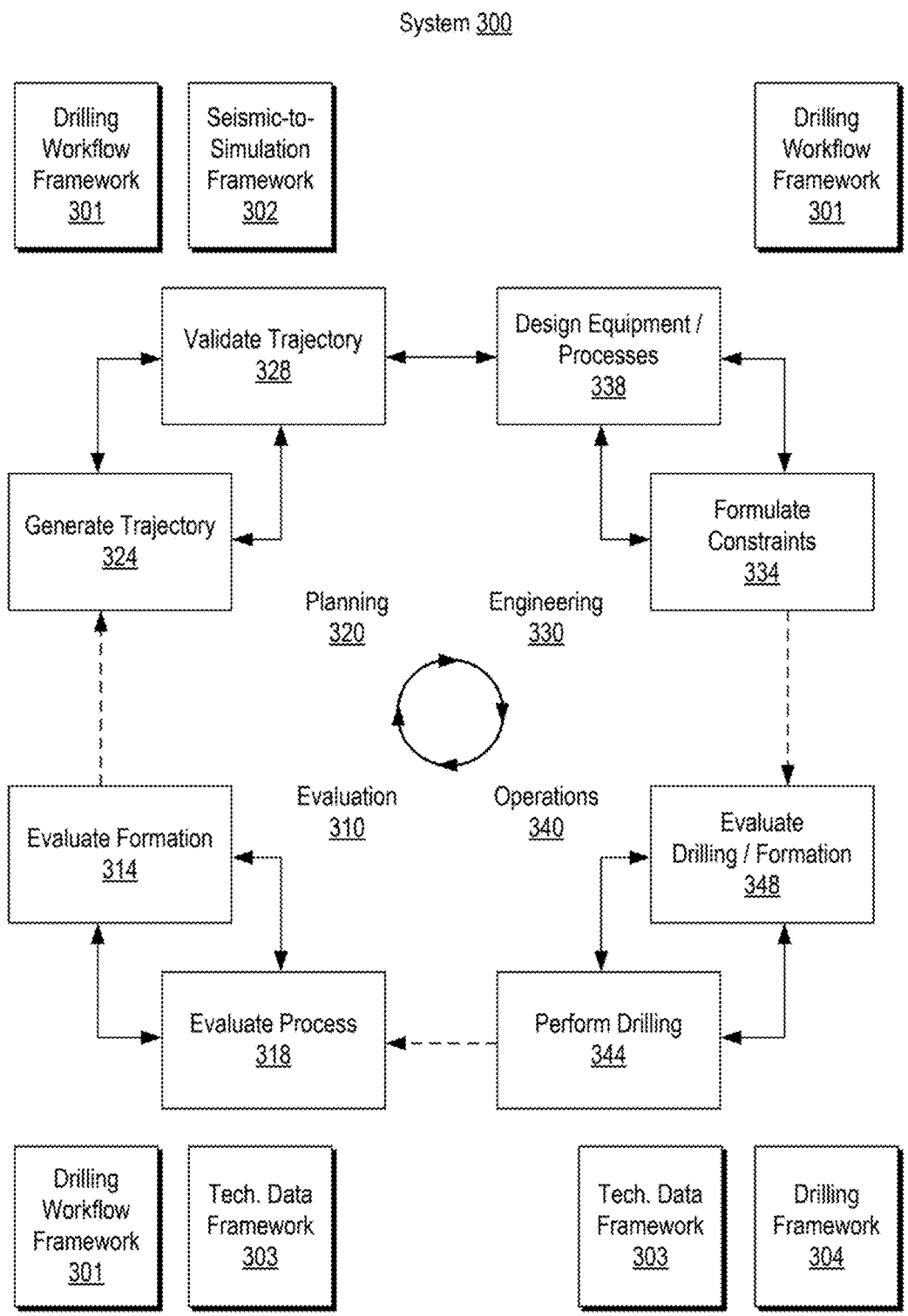
FIG. 3 illustrates an example of a system.

FIG. 3 shows an example of a system 300 that includes various equipment for evaluation 310, planning 320, engineering 330 and operations 340. For example, a drilling workflow framework 301, a seismic-to-simulation framework 302, a technical data framework 303 and a drilling framework 304 may be implemented to perform one or more processes such as a evaluating a formation 314, evaluating a process 318, generating a trajectory 324, validating a trajectory 328, formulating constraints 334, designing equipment and/or processes based at least in part on constraints 338, performing drilling 344 and evaluating drilling and/or formation 348.

In the example of FIG. 3, the seismic-to-simulation framework 302 can be, for example, the PETREL® framework (Schlumberger Limited, Houston, Texas) and the technical data framework 303 can be, for example, the TECHLOG® framework (Schlumberger Limited, Houston, Texas).

As an example, a framework can include entities that may include earth entities, geological objects or other objects such as wells, surfaces, reservoirs, etc. Entities can include virtual representations of actual physical entities that are reconstructed for purposes of one or more of evaluation, planning, engineering, operations, etc.

Entities may include entities based on data acquired via sensing, observation, etc. (e.g., seismic data and/or other information). An entity may be characterized by one or more properties (e.g., a geometrical pillar grid entity of an earth model may be characterized by a porosity property). Such properties may represent one or more measurements (e.g., acquired data), calculations, etc.

A framework may be an object-based framework. In such a framework, entities may include entities based on predefined classes, for example, to facilitate modeling, analysis, simulation, etc. A commercially available example of an object-based framework is the MICROSOFT™ .NET™ framework (Redmond, Washington), which provides a set of extensible object classes. In the .NET™ framework, an object class encapsulates a module of reusable code and associated data structures. Object classes can be used to instantiate object instances for use in by a program, script, etc. For example, borehole classes may define objects for representing boreholes based on well data.

As an example, a framework can include an analysis component that may allow for interaction with a model or model-based results (e.g., simulation results, etc.). As to simulation, a framework may operatively link to or include a simulator such as the ECLIPSE® reservoir simulator (Schlumberger Limited, Houston Texas), the INTERSECT® reservoir simulator (Schlumberger Limited, Houston Texas), etc.

The aforementioned PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, well engineers, reservoir engineers, etc.) can develop collaborative workflows and integrate operations to streamline processes. Such a framework may be considered an application and may be considered a data-driven application (e.g., where data is input for purposes of modeling, simulating, etc.).

As an example, one or more frameworks may be interoperative and/or run upon one or another. As an example, consider the commercially available framework environment marketed as the OCEAN® framework environment (Schlumberger Limited, Houston, Texas), which allows for integration of add-ons (or plug-ins) into a PETREL® framework workflow. The OCEAN® framework environment leverages .NET™ tools (Microsoft Corporation, Redmond, Washington) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

As an example, a framework can include a model simulation layer along with a framework services layer, a framework core layer and a modules layer. The framework may include the commercially available OCEAN® framework where the model simulation layer can include or operatively link to the commercially available PETREL® model-centric software package that hosts OCEAN® framework applications. In an example embodiment, the PETREL® software may be considered a data-driven application. The PETREL® software can include a framework for model building and visualization. Such a model may include one or more grids.

As an example, the model simulation layer may provide domain objects, act as a data source, provide for rendering and provide for various user interfaces. Rendering may provide a graphical environment in which applications can display their data while the user interfaces may provide a common look and feel for application user interface components.

As an example, domain objects can include entity objects, property objects and optionally other objects. Entity objects may be used to geometrically represent wells, surfaces, reservoirs, etc., while property objects may be used to provide property values as well as data versions and display parameters. For example, an entity object may represent a well where a property object provides log information as well as version information and display information (e.g., to display the well as part of a model).

As an example, data may be stored in one or more data sources (or data stores, generally physical data storage devices), which may be at the same or different physical sites and accessible via one or more networks. As an example, a model simulation layer may be configured to model projects. As such, a particular project may be stored where stored project information may include inputs, models, results and cases. Thus, upon completion of a modeling session, a user may store a project. At a later time, the project can be accessed and restored using the model simulation layer, which can recreate instances of the relevant domain objects.

As an example, the system 300 may be used to perform one or more workflows. A workflow may be a process that includes a number of worksteps. A workstep may operate on data, for example, to create new data, to update existing data, etc. As an example, a workflow may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable at least in part in the PETREL® software, for example, that operates on seismic data, seismic attribute(s), etc.

As an example, seismic data can be data acquired via a seismic survey where sources and receivers are positioned in a geologic environment to emit and receive seismic energy where at least a portion of such energy can reflect off subsurface structures. As an example, a seismic data analysis framework or frameworks (e.g., consider the OMEGA® framework, marketed by Schlumberger Limited, Houston, Texas) may be utilized to determine depth, extent, properties, etc. of subsurface structures. As an example, seismic data analysis can include forward modeling and/or inversion, for example, to iteratively build a model of a subsurface region of a geologic environment. As an example, a seismic data analysis framework may be part of or operatively coupled to a seismic-to-simulation framework (e.g., the PETREL® framework, etc.).

As an example, a workflow may be a process implementable at least in part in the OCEAN® framework. As an example, a workflow may include one or more worksteps that access a module such as a plug-in (e.g., external executable code, etc.).

As an example, a framework may provide for modeling petroleum systems. For example, the commercially available modeling framework marketed as the PETROMOD® framework (Schlumberger Limited, Houston, Texas) includes features for input of various types of information (e.g., seismic, well, geological, etc.) to model evolution of a sedimentary basin. The PETROMOD® framework provides for petroleum systems modeling via input of various data such as seismic data, well data and other geological data, for example, to model evolution of a sedimentary basin. The PETROMOD® framework may predict if, and how, a reservoir has been charged with hydrocarbons, including, for example, the source and timing of hydrocarbon generation, migration routes, quantities, pore pressure and hydrocarbon type in the subsurface or at surface conditions. In combination with a framework such as the PETREL® framework, workflows may be constructed to provide basin-to-prospect scale exploration solutions. Data exchange between frameworks can facilitate construction of models, analysis of data (e.g., PETROMOD® framework data analyzed using PETREL® framework capabilities), and coupling of workflows.

As mentioned, a drillstring can include various tools that may make measurements. As an example, a wireline tool or another type of tool may be utilized to make measurements. As an example, a tool may be configured to acquire electrical borehole images. As an example, the fullbore Formation MicroImager (FMI) tool (Schlumberger Limited, Houston, Texas) can acquire borehole image data. A data acquisition sequence for such a tool can include running the tool into a borehole with acquisition pads closed, opening and pressing the pads against a wall of the borehole, delivering electrical current into the material defining the borehole while translating the tool in the borehole, and sensing current remotely, which is altered by interactions with the material.

Analysis of formation information may reveal features such as, for example, vugs, dissolution planes (e.g., dissolution along bedding planes), stress-related features, dip events, etc. As an example, a tool may acquire information that may help to characterize a reservoir, optionally a fractured reservoir where fractures may be natural and/or artificial (e.g., hydraulic fractures). As an example, information acquired by a tool or tools may be analyzed using a framework such as the TECHLOG® framework. As an example, the TECHLOG® framework can be interoperable with one or more other frameworks such as, for example, the PETREL® framework.

As an example, various aspects of a workflow may be completed automatically, may be partially automated, or may be completed manually, as by a human user interfacing with a software application. As an example, a workflow may be cyclic, and may include, as an example, four stages such as, for example, an evaluation stage (see, e.g., the evaluation equipment 310), a planning stage (see, e.g., the planning equipment 320), an engineering stage (see, e.g., the engineering equipment 330) and an execution stage (see, e.g., the operations equipment 340). As an example, a workflow may commence at one or more stages, which may progress to one or more other stages (e.g., in a serial manner, in a parallel manner, in a cyclical manner, etc.).

As an example, a workflow can commence with an evaluation stage, which may include a geological service provider evaluating a formation (see, e.g., the evaluation block 314). As an example, a geological service provider may undertake the formation evaluation using a computing system executing a software package tailored to such activity; or, for example, one or more other suitable geology platforms may be employed (e.g., alternatively or additionally). As an example, the geological service provider may evaluate the formation, for example, using earth models, geophysical models, basin models, petrotechnical models, combinations thereof, and/or the like. Such models may take into consideration a variety of different inputs, including offset well data, seismic data, pilot well data, other geologic data, etc. The models and/or the input may be stored in the database maintained by the server and accessed by the geological service provider.

As an example, a workflow may progress to a geology and geophysics ("G&G") service provider, which may generate a well trajectory (see, e.g., the generation block 324), which may involve execution of one or more G&G software packages. Examples of such software packages include the PETREL® framework. As an example, a G&G service provider may determine a well trajectory or a section thereof, based on, for example, one or more model(s) provided by a formation evaluation (e.g., per the evaluation block 314), and/or other data, e.g., as accessed from one or more databases (e.g., maintained by one or more servers, etc.). As an example, a well trajectory may take into consideration various "basis of design" (BOD) constraints, such as general surface location, target (e.g., reservoir) location, and the like. As an example, a trajectory may incorporate information about tools, bottom-hole assemblies, casing sizes, etc., that may be used in drilling the well. A well trajectory determination may take into consideration a variety of other parameters, including risk tolerances, fluid weights and/or plans, bottom-hole pressures, drilling time, etc.

As an example, a workflow may progress to a first engineering service provider (e.g., one or more processing machines associated therewith), which may validate a well trajectory and, for example, relief well design (see, e.g., the validation block 328). Such a validation process may include evaluating physical properties, calculations, risk tolerances, integration with other aspects of a workflow, etc. As an example, one or more parameters for such determinations may be maintained by a server and/or by the first engineering service provider; noting that one or more model(s), well trajectory(ies), etc. may be maintained by a server and accessed by the first engineering service provider. For example, the first engineering service provider may include one or more computing systems executing one or more software packages. As an example, where the first engineering service provider rejects or otherwise suggests an adjustment to a well trajectory, the well trajectory may be adjusted or a message or other notification sent to the G&G service provider requesting such modification.

As an example, one or more engineering service providers (e.g., first, second, etc.) may provide a casing design, bottom-hole assembly (BHA) design, fluid design, and/or the like, to implement a well trajectory (see, e.g., the design block 338). In some embodiments, a second engineering service provider may perform such design using one of more software applications. Such designs may be stored in one or more databases maintained by one or more servers, which may, for example, employ STUDIO® framework tools, and may be accessed by one or more of the other service providers in a workflow.

As an example, a second engineering service provider may seek approval from a third engineering service provider for one or more designs established along with a well trajectory. In such an example, the third engineering service provider may consider various factors as to whether the well engineering plan is acceptable, such as economic variables (e.g., oil production forecasts, costs per barrel, risk, drill time, etc.), and may request authorization for expenditure, such as from the operating company's representative, well-owner's representative, or the like (see, e.g., the formulation block 334). As an example, at least some of the data upon which such determinations are based may be stored in one or more database maintained by one or more servers. As an example, a first, a second, and/or a third engineering service provider may be provided by a single team of engineers or even a single engineer, and thus may or may not be separate entities.

As an example, where economics may be unacceptable or subject to authorization being withheld, an engineering service provider may suggest changes to casing, a bottom-hole assembly, and/or fluid design, or otherwise notify and/or return control to a different engineering service provider, so that adjustments may be made to casing, a bottom-hole assembly, and/or fluid design. Where modifying one or more of such designs is impracticable within well constraints, trajectory, etc., the engineering service provider may suggest an adjustment to the well trajectory and/or a workflow may return to or otherwise notify an initial engineering service provider and/or a G&G service provider such that either or both may modify the well trajectory.

As an example, a workflow can include considering a well trajectory, including an accepted well engineering plan, and a formation evaluation. Such a workflow may then pass control to a drilling service provider, which may implement the well engineering plan, establishing safe and efficient drilling, maintaining well integrity, and reporting progress as well as operating parameters (see, e.g., the blocks 344 and 348). As an example, operating parameters, formation encountered, data collected while drilling (e.g., using logging-while-drilling or measuring-while-drilling technology), may be returned to a geological service provider for evaluation. As an example, the geological service provider may then re-evaluate the well trajectory, or one or more other aspects of the well engineering plan, and may, in some cases, and potentially within predetermined constraints, adjust the well engineering plan according to the real-life drilling parameters (e.g., based on acquired data in the field, etc.).

Whether the well is entirely drilled, or a section thereof is completed, depending on the specific embodiment, a workflow may proceed to a post review (see, e.g., the evaluation block 318). As an example, a post review may include reviewing drilling performance. As an example, a post review may further include reporting the drilling performance (e.g., to one or more relevant engineering, geological, or G&G service providers).

Various activities of a workflow may be performed consecutively and/or may be performed out of order (e.g., based partially on information from templates, nearby wells, etc. to fill in any gaps in information that is to be provided by another service provider). As an example, undertaking one activity may affect the results or basis for another activity, and thus may, either manually or automatically, call for a variation in one or more workflow activities, work products, etc. As an example, a server may allow for storing information on a central database accessible to various service providers where variations may be sought by communication with an appropriate service provider, may be made automatically, or may otherwise appear as suggestions to the relevant service provider. Such an approach may be considered to be a holistic approach to a well workflow, in comparison to a sequential, piecemeal approach.

As an example, various actions of a workflow may be repeated multiple times during drilling of a wellbore. For example, in one or more automated systems, feedback from a drilling service provider may be provided at or near real-time, and the data acquired during drilling may be fed to one or more other service providers, which may adjust its piece of the workflow accordingly. As there may be dependencies in other areas of the workflow, such adjustments may permeate through the workflow, e.g., in an automated fashion. In some embodiments, a cyclic process may additionally or instead proceed after a certain drilling goal is reached, such as the completion of a section of the wellbore, and/or after the drilling of the entire wellbore, or on a per-day, week, month, etc. basis.

Well planning can include determining a path of a well that can extend to a reservoir, for example, to economically produce fluids such as hydrocarbons therefrom. Well planning can include selecting a drilling and/or completion assembly which may be used to implement a well plan. As an example, various constraints can be imposed as part of well planning that can impact design of a well. As an example, such constraints may be imposed based at least in part on information as to known geology of a subterranean domain, presence of one or more other wells (e.g., actual and/or planned, etc.) in an area (e.g., consider collision avoidance), etc. As an example, one or more constraints may be imposed based at least in part on characteristics of one or more tools, components, etc. As an example, one or more constraints may be based at least in part on factors associated with drilling time and/or risk tolerance.

As an example, a system can allow for a reduction in waste, for example, as may be defined according to LEAN. In the context of LEAN, consider one or more of the following types of waste: transport (e.g., moving items unnecessarily, whether physical or data); inventory (e.g., components, whether physical or informational, as work in process, and finished product not being processed); motion (e.g., people or equipment moving or walking unnecessarily to perform desired processing); waiting (e.g., waiting for information, interruptions of production during shift change, etc.); overproduction (e.g., production of material, information, equipment, etc. ahead of demand); over Processing (e.g., resulting from poor tool or product design creating activity); and defects (e.g., effort involved in inspecting for and fixing defects whether in a plan, data, equipment, etc.). As an example, a system that allows for actions (e.g., methods, workflows, etc.) to be performed in a collaborative manner can help to reduce one or more types of waste.

As an example, a system can be utilized to implement a method for facilitating distributed well engineering, planning, and/or drilling system design across multiple computation devices where collaboration can occur among various different users (e.g., some being local, some being remote, some being mobile, etc.). In such a system, the various users via appropriate devices may be operatively coupled via one or more networks (e.g., local and/or wide area networks, public and/or private networks, land-based, marine-based and/or areal networks, etc.).

As an example, a system may allow well engineering, planning, and/or drilling system design to take place via a subsystems approach where a wellsite system is composed of various subsystem, which can include equipment subsystems and/or operational subsystems (e.g., control subsystems, etc.). As an example, computations may be performed using various computational platforms/devices that are operatively coupled via communication links (e.g., network links, etc.). As an example, one or more links may be operatively coupled to a common database (e.g., a server site, etc.). As an example, a particular server or servers may manage receipt of notifications from one or more devices and/or issuance of notifications to one or more devices. As an example, a system may be implemented for a project where the system can output a well plan, for example, as a digital well plan, a paper well plan, a digital and paper well plan, etc. Such a well plan can be a complete well engineering plan or design for the particular project.

Figure 4:
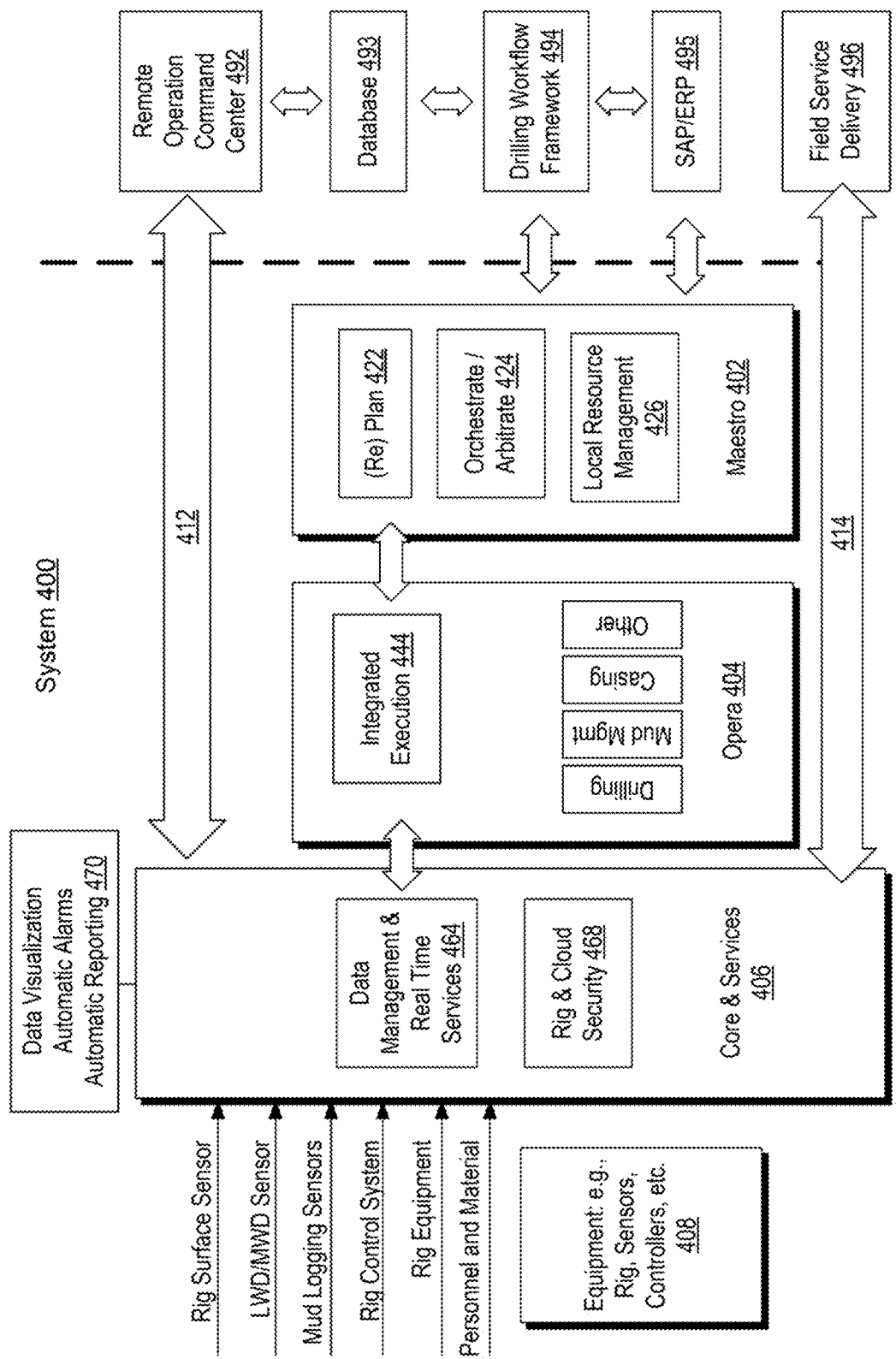
FIG. 4 illustrates an example of a system.

FIG. 4 shows an example of a system 400 that includes various components that can be local to a wellsite and includes various components that can be remote from a wellsite. As shown, the system 400 includes a Maestro block 402, an Opera block 404, a Core & Services block 406 and an Equipment block 408. These blocks can be labeled in one or more manners other than as shown in the example of FIG. 4. In the example of FIG. 4, the blocks 402, 404, 406 and 408 can be defined by one or more of operational features, functions, relationships in an architecture, etc.

As an example, the blocks 402, 404, 406 and 408 may be described in a pyramidal architecture where, from peak to base, a pyramid includes the Maestro block 402, the Opera block 404, the Core & Services block 406 and the Equipment block 408.

As an example, the Maestro block 402 can be associated with a well management level (e.g., well planning and/or orchestration) and can be associated with a rig management level (e.g., rig dynamic planning and/or orchestration). As an example, the Opera block 404 can be associated with a process management level (e.g., rig integrated execution). As an example, the Core & Services block 406 can be associated with a data management level (e.g., sensor, instrumentation, inventory, etc.). As an example, the Equipment block 408 can be associated with a wellsite equipment level (e.g., wellsite subsystems, etc.).

As an example, the Maestro block 402 may receive information from a drilling workflow framework and/or one or more other sources, which may be remote from a wellsite.

In the example of FIG. 4, the Maestro block 402 includes a plan/replan block 422, an orchestrate/arbitrate block 424 and a local resource management block 426. In the example of FIG. 4, the Opera block 404 includes an integrated execution block 444, which can include or be operatively coupled to blocks for various subsystems of a wellsite such as a drilling subsystem, a mud management subsystem (e.g., a hydraulics subsystem), a casing subsystem (e.g., casings and/or completions subsystem), and, for example, one or more other subsystems. In the example of FIG. 4, the Core & Services block 406 includes a data management and real-time services block 464 (e.g., real-time or near real-time services) and a rig and cloud security block 468 (e.g., as to provisioning and various type of security measures, etc.). In the example of FIG. 4, the Equipment block 408 is shown as being capable of providing various types of information to the Core & Services block 406. For example, consider information from a rig surface sensor, a LWD/MWD sensor, a mud logging sensor, a rig control system, rig equipment, personnel, material, etc. In the example, of FIG. 4, a block 470 can provide for one or more of data visualization, automatic alarms, automatic reporting, etc. As an example, the block 470 may be operatively coupled to the Core & Services block 406 and/or one or more other blocks.

As mentioned, a portion of the system 400 can be remote from a wellsite. For example, to one side of a dashed line appear a remote operation command center block 492, a database block 493, a drilling workflow framework block 494, a SAP/ERP block 495 and a field services delivery block 496. Various blocks that may be remote can be operatively coupled to one or more blocks that may be local to a wellsite system. For example, a communication link 412 is illustrated in the example of FIG. 4 that can operatively couple the blocks 406 and 492 (e.g., as to monitoring, remote control, etc.), while another communication link 414 is illustrated in the example of FIG. 4 that can operatively couple the blocks 406 and 496 (e.g., as to equipment delivery, equipment services, etc.). Various other examples of possible communication links are also illustrated in the example of FIG. 4.

As an example, the system 400 of FIG. 4 may be a field management tool. As an example, the system 400 of FIG. 4 may include a drilling framework (see, e.g., the drilling framework 304). As an example, blocks in the system 400 of FIG. 4 that may be remote from a wellsite.

As an example, a wellbore can be drilled according to a drilling plan that is established prior to drilling. Such a drilling plan, which may be a well plan or a portion thereof, can set forth equipment, pressures, trajectories and/or other parameters that define drilling process for a wellsite. As an example, a drilling operation may then be performed according to the drilling plan (e.g., well plan). As an example, as information is gathered, a drilling operation may deviate from a drilling plan. Additionally, as drilling or other operations are performed, subsurface conditions may change. Specifically, as new information is collected, sensors may transmit data to one or more surface units. As an example, a surface unit may automatically use such data to update a drilling plan (e.g., locally and/or remotely).

As an example, the drilling workflow framework 494 can be or include a G&G system and a well planning system. As an example, a G&G system corresponds to hardware, software, firmware, or a combination thereof that provides support for geology and geophysics. In other words, a geologist who understands the reservoir may decide where to drill the well using the G&G system that creates a three-dimensional model of the subsurface formation and includes simulation tools. The G&G system may transfer a well trajectory and other information selected by the geologist to a well planning system. The well planning system corresponds to hardware, software, firmware, or a combination thereof that produces a well plan. In other words, the well plan may be a high-level drilling program for the well. The well planning system may also be referred to as a well plan generator.

In the example of FIG. 4, various blocks can be components that may correspond to one or more software modules, hardware infrastructure, firmware, equipment, or any combination thereof. Communication between the components may be local or remote, direct or indirect, via application programming interfaces, and procedure calls, or through one or more communication channels.

As an example, various blocks in the system 400 of FIG. 4 can correspond to levels of granularity in controlling operations of associated with equipment and/or personnel in an oilfield. As shown in FIG. 4, the system 400 can include the Maestro block 402 (e.g., for well plan execution), the Opera block 404 (e.g., process manager collection), the Core & Services block 406, and the Equipment block 408.

The Maestro block 402 may be referred to as a well plan execution system. For example, a well plan execution system corresponds to hardware, software, firmware or a combination thereof that performs an overall coordination of the well construction process, such as coordination of a drilling rig and the management of the rig and the rig equipment. A well plan execution system may be configured to obtain the general well plan from well planning system and transform the general well plan into a detailed well plan. The detailed well plan may include a specification of the activities involved in performing an action in the general well plan, the days and/or times to perform the activities, the individual resources performing the activities, and other information.

As an example, a well plan execution system may further include functionality to monitor an execution of a well plan to track progress and dynamically adjust the plan. Further, a well plan execution system may be configured to handle logistics and resources with respect to on and off the rig. As an example, a well plan execution system may include multiple sub-components, such as a detailer that is configured to detail the well planning system plan, a monitor that is configured to monitor the execution of the plan, a plan manager that is configured to perform dynamic plan management, and a logistics and resources manager to control the logistics and resources of the well. In one or more embodiments, a well plan execution system may be configured to coordinate between the different processes managed by a process manager collection (see, e.g., the Opera block 404). In other words, a well plan execution system can communicate and manage resource sharing between processes in a process manager collection while operating at, for example, a higher level of granularity than process manager collection.

As to the Opera block 404, as mentioned, it may be referred to as a process manager collection. In one or more embodiments, a process manager collection can include functionality to perform individual process management of individual domains of an oilfield, such as a rig. For example, when drilling a well, different activities may be performed. Each activity may be controlled by an individual process manager in the process manager collection. A process manager collection may include multiple process managers, whereby each process manager controls a different activity (e.g., activity related to the rig). In other words, each process manager may have a set of tasks defined for the process manager that is particular to the type of physics involved in the activity. For example, drilling a well may use drilling mud, which is fluid pumped into well in order to extract drill cuttings from the well. A drilling mud process manager may exist in a process manager collection that manages the mixing of the drilling mud, the composition, testing of the drilling mud properties, determining whether the pressure is accurate, and performing other such tasks. The drilling mud process manager may be separate from a process manager that controls movement of drill pipe from a well. Thus, a process manager collection may partition activities into several different domains and manages each of the domains individually. Amongst other possible process managers, a process manager collection may include, for example, a drilling process manager, a mud preparation and management process manager, a casing running process manager, a cementing process manager, a rig equipment process manager, and other process managers. Further, a process manager collection may provide direct control or advice regarding the components above. As an example, coordination between process managers in a process manager collection may be performed by a well plan execution system.

As to the Core & Service block 406 (e.g., a core services block or CS block), it can include functionality to manage individual pieces of equipment and/or equipment subsystems. As an example, a CS block can include functionality to handle basic data structure of the oilfield, such as the rig, acquire metric data, produce reports, and manages resources of people and supplies. As an example, a CS block may include a data acquirer and aggregator, a rig state identifier, a real-time (RT) drill services (e.g., near real-time), a reporter, a cloud, and an inventory manager.

As an example, a data acquirer and aggregator can include functionality to interface with individual equipment components and sensor and acquire data. As an example, a data acquirer and aggregator may further include functionality to interface with sensors located at the oilfield.

As an example, a rig state identifier can includes functionality to obtain data from the data acquirer and aggregator and transform the data into state information. As an example, state information may include health and operability of a rig as well as information about a particular task being performed by equipment.

As an example, RT drill services can include functionality to transmit and present information to individuals. In particular, the RT drill services can include functionality to transmit information to individuals involved according to roles and, for example, device types of each individual (e.g., mobile, desktop, etc.). In one or more embodiments, information presented by RT drill services can be context specific, and may include a dynamic display of information so that a human user may view details about items of interest.

As an example, in one or more embodiments, a reporter can include functionality to generate reports. For example, reporting may be based on requests and/or automatic generation and may provide information about state of equipment and/or people.

As an example, a wellsite "cloud" framework can correspond to an information technology infrastructure locally at an oilfield, such as an individual rig in the oilfield. In such an example, the wellsite "cloud" framework may be an "Internet of Things" (I) framework. As an example, a wellsite "cloud" framework can be an edge of the cloud (e.g., a network of networks) or of a private network.

As an example, an inventory manager can be a block that includes functionality to manage materials, such as a list and amount of each resource on a rig.

In the example of FIG. 4, the Equipment block 408 can correspond to various controllers, control unit, control equipment, etc. that may be operatively coupled to and/or embedded into physical equipment at a wellsite such as, for example, rig equipment. For example, the Equipment block 408 may correspond to software and control systems for individual items on the rig. As an example, the Equipment block 408 may provide for monitoring sensors from multiple subsystems of a drilling rig and provide control commands to multiple subsystem of the drilling rig, such that sensor data from multiple subsystems may be used to provide control commands to the different subsystems of the drilling rig and/or other devices, etc. For example, a system may collect temporally and depth aligned surface data and downhole data from a drilling rig and transmit the collected data to data acquirers and aggregators in core services, which can store the collected data for access onsite at a drilling rig or offsite via a computing resource environment.

As mentioned, the system 400 of FIG. 4 can be associated with a plan where, for example, the plan/replan block 422 can provide for planning and/or re-planning one or more operations, etc.

Figure 5:
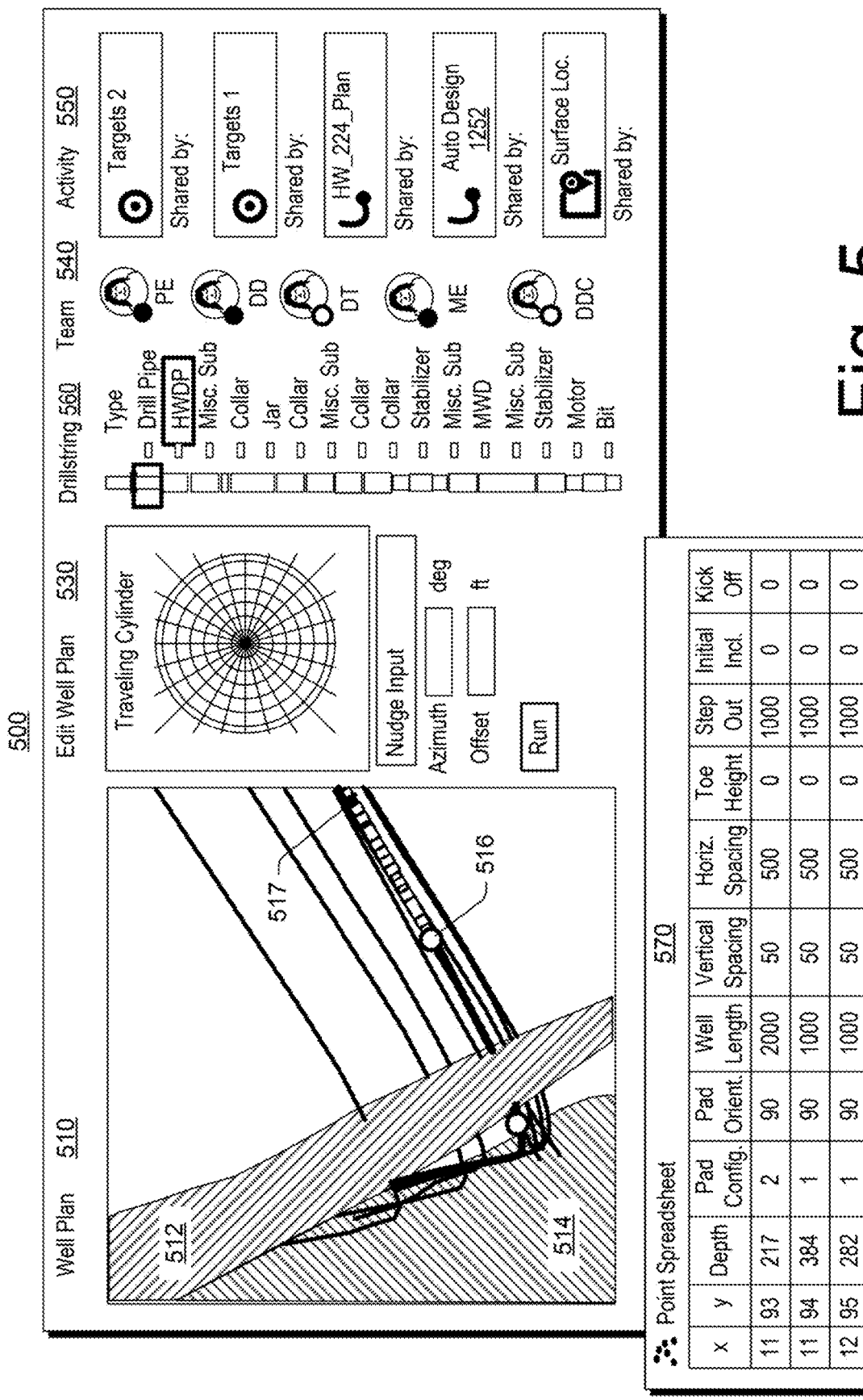
FIG. 5 illustrates an example of a graphical user interface.

FIG. 5 shows an example of a graphical user interface (GUI) 500 that includes information associated with a well plan. Specifically, the GUI 500 includes a panel 510 where surfaces representations 512 and 514 are rendered along with well trajectories where a location 516 can represent a position of a drillstring 517 along a well trajectory. The GUI 500 may include one or more editing features such as an edit well plan set of features 530. The GUI 500 may include information as to individuals of a team 540 that are involved, have been involved and/or are to be involved with one or more operations. The GUI 500 may include information as to one or more activities 550. As shown in the example of FIG. 5, the GUI 500 can include a graphical control of a drillstring 560 where, for example, various portions of the drillstring 560 may be selected to expose one or more associated parameters (e.g., type of equipment, equipment specifications, operational history, etc.). FIG. 5 also shows a table 570 as a point spreadsheet that specifies information for a plurality of wells.

Figure 6:
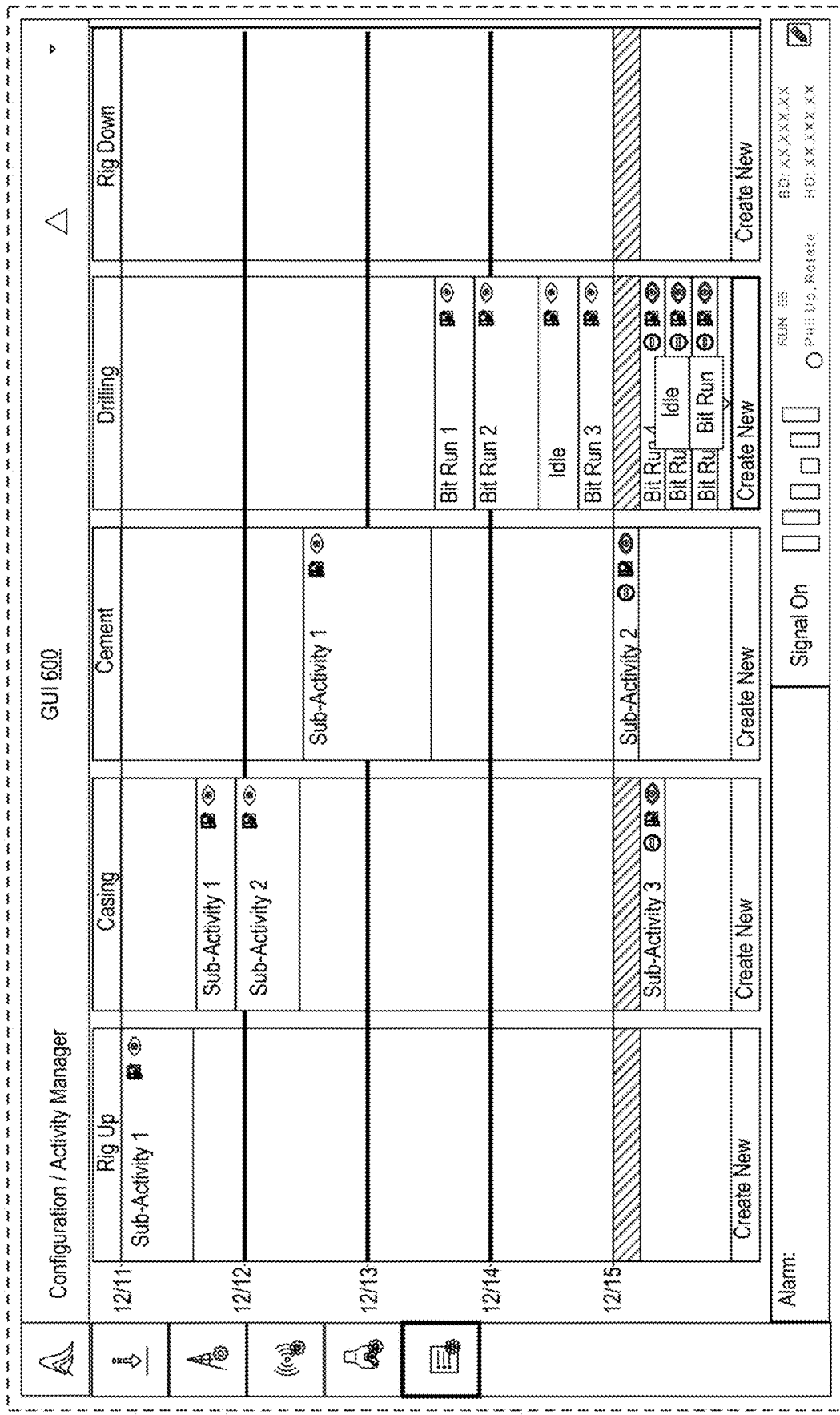
FIG. 6 illustrates an example of a graphical user interface.

FIG. 6 shows an example of a graphical user interface (GUI) 600 that includes a calendar with dates for various operations that can be part of a plan. For example, the GUI 600 shows rig up, casing, cement, drilling and rig down operations that can occur over various periods of time. Such a GUI may be editable via selection of one or more graphical controls.

As explained, a plan can include various plan parameters, which may represent plan states at one or more points in time. As an example, a method can include representing a plan as a two-dimensional or three-dimensional data structure. For example, consider a method that includes representing a plan as a two-dimensional array such as a pixel array of a two-dimensional image. As an example, a three-dimensional array may be a voxel array where such an array may optionally be sliced to generate one or more two-dimensional arrays.

As an example, a method can include converting plan inputs into pixel-grids that can be interpreted as images. In such an example, the pixel-grids can be given as input to a convolutional neural network-based image interpretation processes. In such an example, a computational framework can recognize a state of a physical system such as a rig system, etc. Such a method may optionally be implemented via one or more portions of a system such as the system 400 of FIG. 4. For example, the Maestro block 402 of the system 400 can include components for implementation of a method that include image-based interpretation, which may generate one or more outputs (e.g., control outputs, planning outputs, etc.).

A convolutional neural network (CNN) can be a class of deep, feed-forward artificial neural networks that is suitable for analyzing visual imagery. As mentioned, for one or more field operations, various states can exist where one or more states may be represented as an image or images. Such an image or images can be structured for analysis rather than visual inspection by the human eye. For example, a CNN may be applied to recognizing images of animals as in pixel-based photographs where a human can confirm via visual inspection that an input image of a cow has been properly classified by the CNN to be an image of a cow; whereas, for field operations (e.g., planning, execution, etc.), a pixel-based image may have little recognizable information to a human via visual inspection, yet a CNN can be utilized, for example, to classify the pixel-based image as corresponding to one or more states of one or more field operations (e.g., equipment, flows, rock conditions, etc.). Such a pixel-based image may be representative of a single point in time or may be representative of multiple points in time. In either instance, a CNN approach may be implemented for one or more purposes.

Terminology as to CNNs tends to involve visual or perception descriptors where, herein, such descriptors can be applied to analysis of what may be considered "non-image" data that are organized in an image format (e.g., in a pixel-based format, etc.).

CNNs can use a variation of multilayer perceptrons designed for minimal preprocessing. CNNs may be shift invariant or space invariant artificial neural networks (SIANN), based on their shared-weights architecture and translation invariance characteristics.

Convolutional neural networks, as neural networks generally, find a basis within biological processes in which a connectivity pattern between neurons is inspired by organization of an animal's visual cortex. For example, individual cortical neurons tend to respond to stimuli in a restricted region of a visual field known as the receptive field where receptive fields of different neurons partially overlap such that they cover the entire visual field within an animal's view.

CNNs tend to use relatively little pre-processing compared to some other types of image classification algorithms. As such, a network learns filters that in other approaches may have been hand-engineered. Independence from prior knowledge and human effort in feature design can be beneficial.

As an example, a method can include one or more deep neural networks that can be trained, for example, to provide domain specific heuristics. Such heuristics may provide for improved planning efficiency, robustness and/or adaptability. For example, consider a method where results of learning using deep neural networks are used to guide heuristic search during plan generation, for example, using a learned policy network to limit width of search and a learned value network to limit depth of search.

Figure 7:
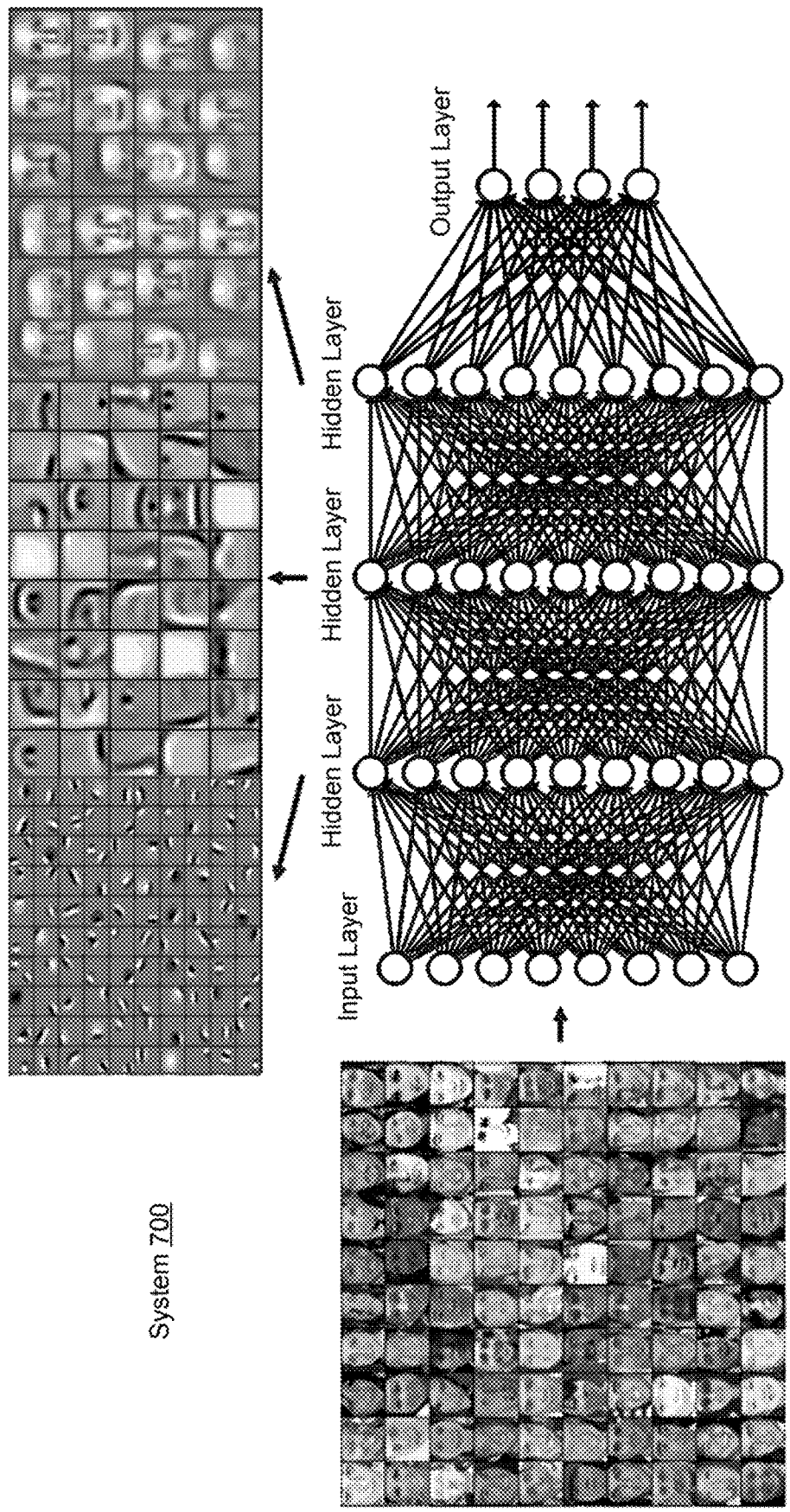
FIG. 7 illustrates an example of a system.

FIG. 7 shows an example of a system 700 that includes a deep neural network (DNN) applied to computer vision. As shown, the system 700 can receive information via an input layer, analyze information via hidden layers and output information via an output layer. The information received at the input layer can be images such as facial images that are composed of pixels, which may be in a color space (e.g., RGB, grayscale, etc.).

The system 700 may learn (e.g., be trained) in one or more manners. Learning may be deep learning. As an example, learning can include unsupervised learning, reinforcement learning, supervised learning, semi-supervised learning, etc.

Deep learning can be applied to tasks where a basic unit, a single pixel, a single frequency, or a single word/character may have a relatively small amount of meaning in and of itself but where a combination of units has a relatively larger amount of meaning. As an example, a combination of units may be assessed as to individual values of the units, which may be collectively useful. As an example, a method can include deep learning of useful combinations of values without human intervention. For example, consider deep learning's ability to learn features from data of a dataset of handwritten digits. In such an example, when presented with tens of thousands of handwritten digits, a deep neural network can learn that it is useful to look for loops and lines when trying to classify the digits.

Deep learning can be implemented using one or more techniques or technologies, such as, for example, an optimizer, stochastic gradient descent, unsupervised data pre-training of models to automate feature extraction, transfer functions, large data set(s) size, multiple processors (e.g., GPUs and/or CPUs) to accommodate considerable computational costs incurred by deep neural network models combined with large datasets, etc.

As an example, each successive layer in a neural network can utilize features from a previous layer to learn more complex features. Consider an example, with reference to the system 700 of FIG. 7, an approach where, at the lowest level, the neural network fixates on patterns of local contrast. A next layer can then use those patterns of local contrast to fixate on data that resemble eyes, noses, and mouths as facial features. Another subsequent layer can (e.g., a top layer) can then apply those facial features to face templates. In such an example, a deep neural network is capable of composing features of increasing complexity in each of its successive layers.

Thus, the system 700 can perform automated learning of data representations and features. Such an application of deep neural networks may include models that can learn useful hierarchical representations of images, audio and written language. For example, consider these learned feature hierarchies in these domains can be construed as:

Image recognition: Pixel→edge→texton→motif→part→object

Text: Character→word→word group→clause→sentence

Speech: Sample→spectral band →sound phone→phoneme→word

Another example of DNN technology exists in AlphaGo (Silver, et. al, Mastering the Game of Go with Deep Neural Networks and Tree Search. Nature, Vol. 529, 28 Jan. 2016, p. 484-489 and appendixes and extended data, which are incorporated by reference herein) as applied to the game "Go", an abstract strategy board game for two players, in which the aim is to surround more territory than the opponent. Go has relatively simple rules yet is very complex, even more so than chess, and possesses a large number of possibilities. Compared to chess, Go has both a larger board with more scope for play and longer games, and, on average, many more alternatives to consider per move. In Go, the playing pieces are called stones. One player uses the white stones and the other, black. The players take turns placing the stones on the vacant intersections (named "points") of a board with a 19×19 grid of lines.

In AlphaGo, DNN technology is trained to learn heuristics that guide search more efficiently in a massive search space. AlphaGo utilizes two kinds of DNNs: a value network to evaluate board positions and a policy network used to evaluate moves, and they are trained by a mix of supervised learning through studying examples provided by human and self-playing in the style of reinforcement learning. These pre-trained DNNs allow the heuristic search algorithm (through Monte Carlo sampling) to identify promising moves without looking ahead thousands of steps and effectively beat world-class human players despite a search space including an astronomical number of states.

As mentioned, planning, such as well planning or more generally operations planning, may be performed in an automated and/or semi-automated manner. Theoretically, even without numeric conditions and effects, automated planning can be in the complexity class of PSPACE-complete, and undecidable when numeric reasoning is included. Planning can be at least as difficult as Go (PSPACE-hard without Ko).

As an example, plan generation can involve traversing a huge search tree, and finding a path from an initial state to a goal state, which can be computationally intractable.

A planning task or workflow may be expressed in a Planning Domain Definition Language (PDDL) that may be a PDDL that attempts to standardize Artificial Intelligence (AI) planning languages. A PDDL planner may use a generic heuristic based on a relaxed planning graph (RPG) approach to evaluate each state visited, computing heuristic values that indicate which state is closer to a goal than others, and expanding from that state. Such a strategy, the so-called enforced hill climbing process, can be supplemented by breadth-first search on plateaus. The RPG heuristic, although it can operate with various planning domains, can underestimate the distance to the goal, which can lead to poor guidance.

Learning planning heuristics using DNN can provide for generation of more adaptive and robust heuristics that may address more planning domain instances and problem instances.

As an example, a system can utilize DNN techniques to learn planning heuristics and may include the following two parts: a supervised learning phase and a deep reinforcement learning phase.

As to a supervised learning phase, a DNN can be trained by planning instances generated by a planner for a number of planning domains and problems. By identifying structural representations of state that echo spatial correlations, the deep convolutional network might involve an input layer, convolutional layer, RELU layer, pooling layer and a fully connected layer. The training data can be generated following the method of (Garret, et. al, Learning to Rank for Synthesizing Planning Heuristics, International Joint Conference on Artificial Intelligence (IJCAI) 2016 (https://arxiv.org/abs/1608.01302), which is incorporated by reference herein). As an example, through a supervised learning phase, a learner can at least learn the results slightly better than current RPG-based heuristics (e.g., which may correspond to the value network in the technique of AlphaGo).

As to a deep reinforcement learning phase, after obtaining a preliminary version of a value network, a learner can evaluate applicable actions against this network (e.g., as well as the domain-independent heuristic) and thus train a policy network following the approach of deep reinforcement learning. In such an approach, a policy network can be learned (e.g., which action is best in which state) which can eventually establish a mapping between states and actions (a policy, in the terminology of reinforcement learning).

As to planning, a planner can search as follows. At each state, the value network is used to decide the most promising state to expand, and the policy network is used to decide the most promising applicable action to apply to expand that state.

As an example, a planning system can exploit deep learning in the realm of symbolic artificial intelligence and can exploit the influence of deep learning in the area of heuristic search. As an example, a planning system or planner can be implemented with highly adaptive planning heuristics for a wide range of tasks and/or with robust and efficient planning algorithms that address large and real tasks.

As an example, a plan can construct sequences of actions which, when applied to an initial state, produce a goal state after some time has passed. In such an example, a planner can search a massively combinatorial space of actions to find these sequences with powerful search guidance. As an example, CNN-based Deep Learning techniques may be implemented to learn search control for an automated planner.

Figure 8:
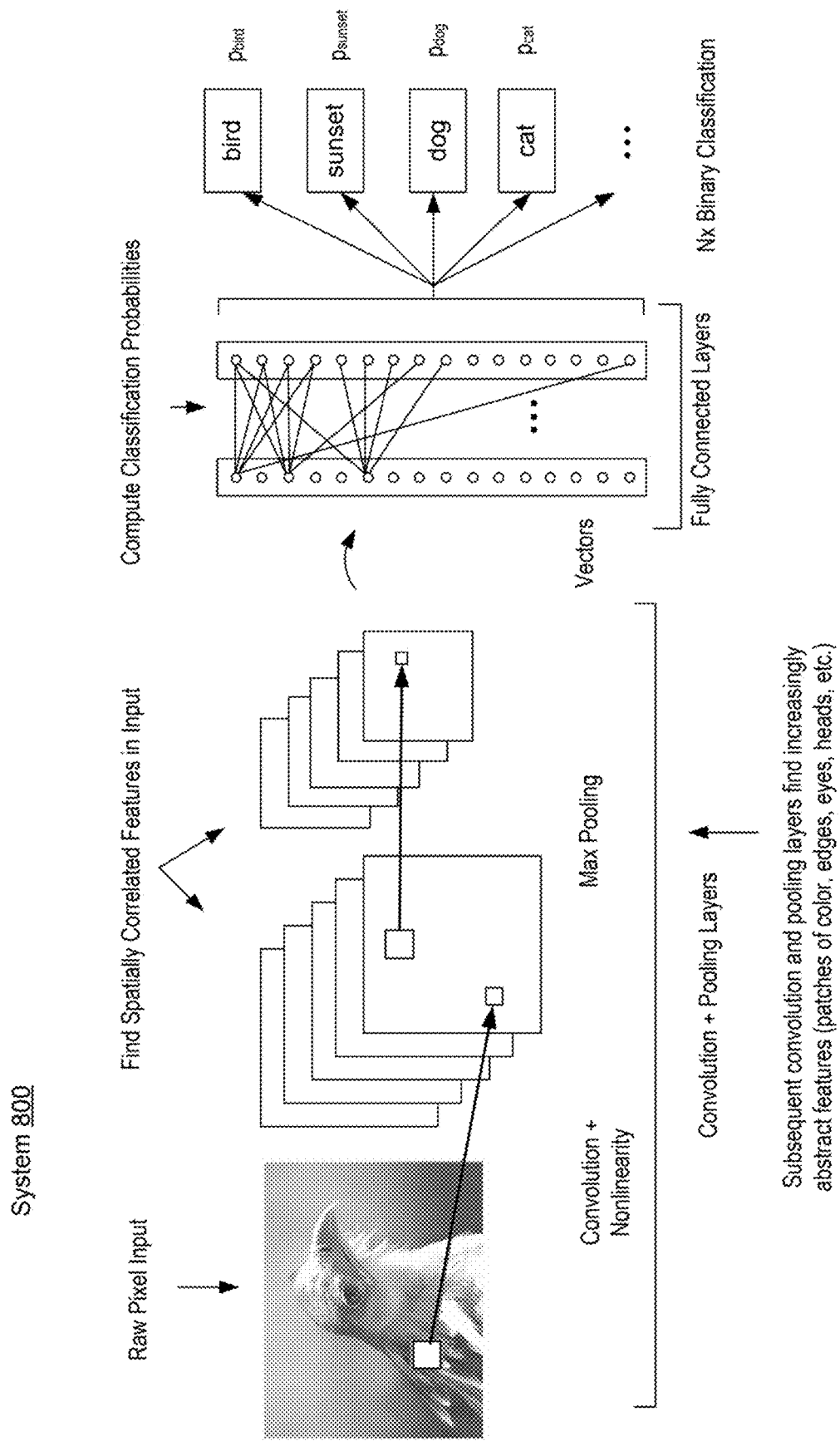
FIG. 8 illustrates an example of a system.

FIG. 8 shows an example of a system 800 for machine classification and learning. As shown, the system includes convolution and pooling layers, fully connected layers and Nx binary classifications as outputs. In the example of FIG. 8, input is a raw pixel image where convolution and non-linearity techniques are implemented for finding spatially correlated features in the input image, for example, via maximum pooling. Convolutional networks can include local or global pooling that combine outputs into an input or inputs (e.g., for another layer or layers). Maximum pooling (or "max pooling") may use the maximum value from each of a cluster of neurons at the prior layer while average pooling (or "ave pooling") may use the average value from each of a cluster of neurons at the prior layer.

As shown, the system 800 can compute classification probabilities for a vector via fully connected layers such that classifications can be made, which, in the example of FIG. 8, pertain to image content (e.g., bird, sunset, dog, cat, etc.). As indicated, subsequent convolution and pooling layers can find increasingly abstract features (e.g., patches of color, edges, eyes, heads, etc.) within image data. Referring again to the system 700 of FIG. 7, some examples of features associated with hidden layers are shown, for example, the middle set of images may pertain to various types of curved or circular features (e.g., a pupil in an eye, an ear fold, a nostril opening, etc.).

Figure 9:
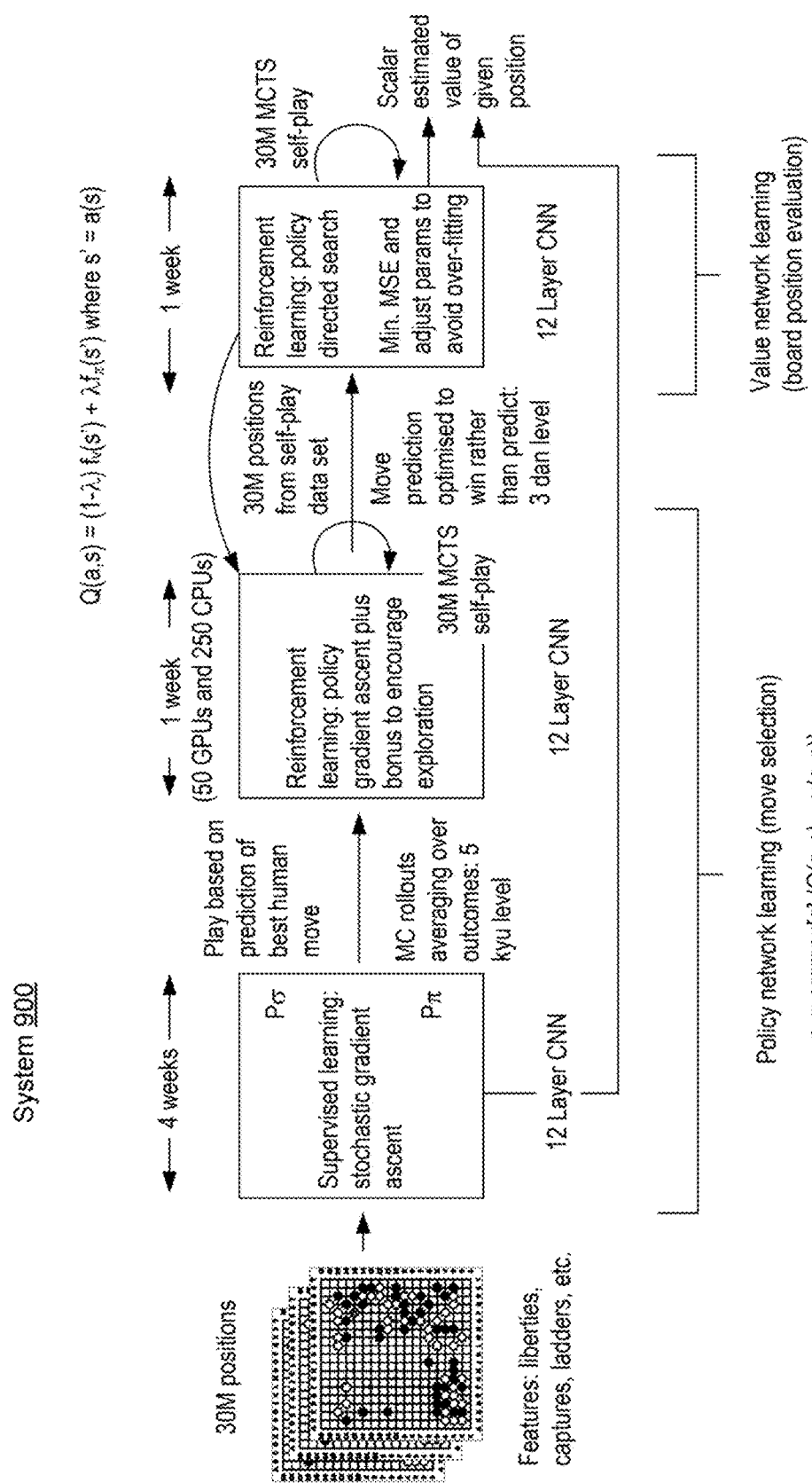
FIG. 9 illustrates an example of a system.

FIG. 9 shows another example of a system 900 that pertains to the game Go. The system 900 includes a policy network portion and a value network portion. As shown, input includes 30 million positions (e.g., feature data) and output includes a scalar estimated value of a given position.

In FIG. 9, various types of hardware are referenced, including 50 GPUs and 250 CPUs. One or more types of circuitry may be utilized in a computational framework that performs a process or processes as in FIG. 9. Time periods are also shown in FIG. 9, including a 4 week period of supervised learning with stochastic gradient ascent, a 1 week period with reinforcement learning for policy gradient ascent plus bonus to encourage exploration (e.g., to avoid overtraining to a fixed set of possibilities), and a 1 week period with reinforcement learning for policy directed search. As shown, the value network learning pertains to board position evaluation while the policy network learning pertains to move selection. In FIG. 9, an equation is shown that can allow for implementation of a level of exploration.

As an example, a method can include converting plan inputs into pixel-grids that can be interpreted as images. In such an example, the pixel-grids can be given as input to an existing CNN-based image interpretation processes. Such an approach can allow an automated system to "recognize" a state of a planned system or systems (e.g., a well plan, a field plan for a plurality of wells, etc.).

As an example, a method can include identifying a "best" action to select next. For example, where a well operation is underway according to a well plan, which can be an active digital well plan represented as an image (e.g., a pixel image), the well plan may be analyzed to determine a current state. Given the current state, a system can then identify one or more modifications to the well plan for action(s) to be taken immediately and/or after a period of time or periods of time.

As an example, a computational framework may be utilized during execution of one or more plans as to field operations (e.g., rig operations, etc.). In such an example, the computational framework may output information that can include one or more of alarms, recommendations, control signals, etc. As an example, a computational framework may provide for determining a current state and may provide for determining a next state where the next state can be a desirable state that can be achieved via one or more actions. In such an example, the computational framework may output one or more signals that can be directly and/or indirectly utilized to achieve the next state.

Figure 10:
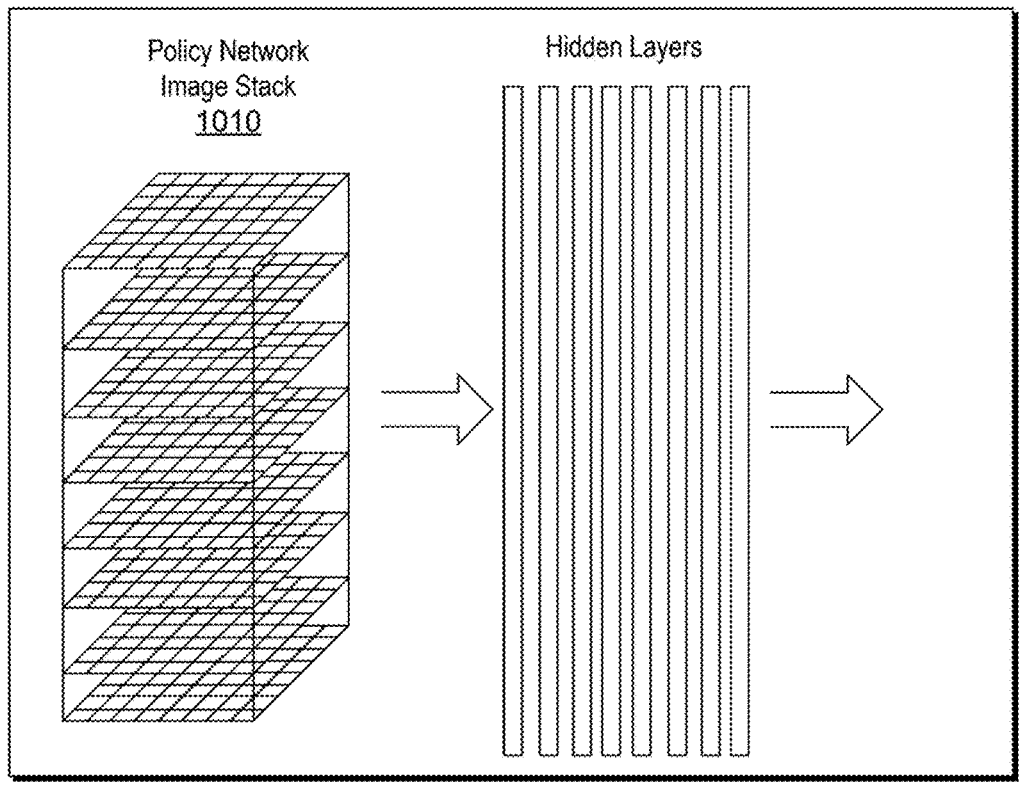
FIG. 10 illustrates an example of a system.
Figure 10:
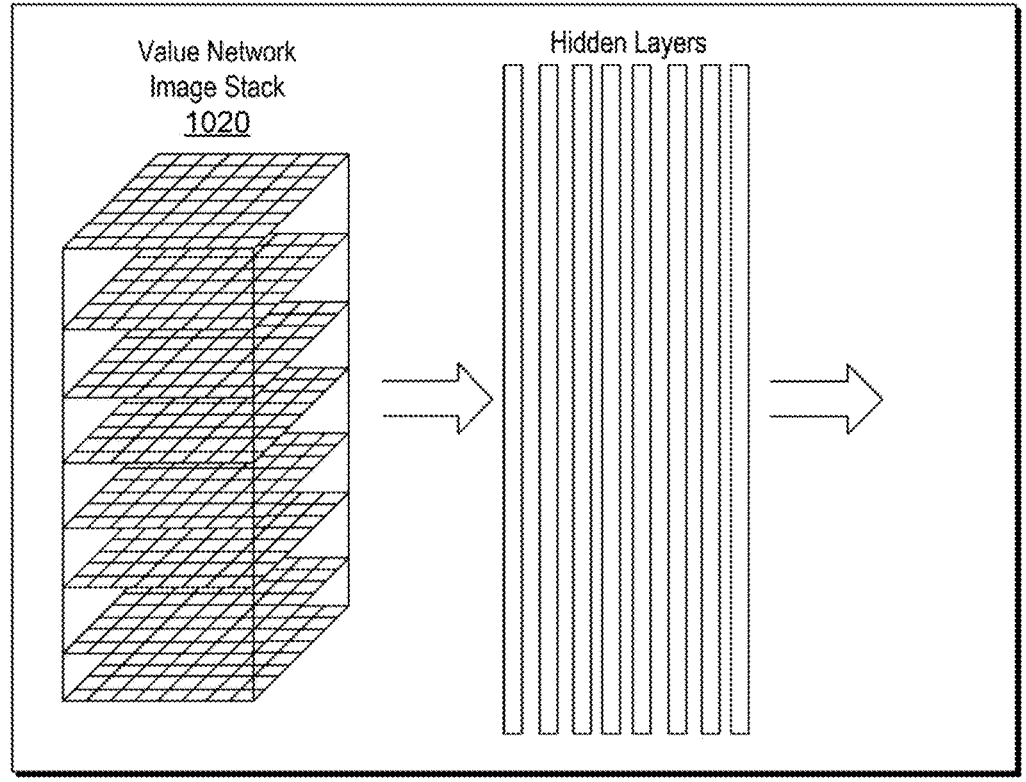

FIG. 10 shows an example of a policy network image stack 1010 and a value network image stack 1020 where each of the stacks has associated hidden layers of a DNN. In such an example, the images can represent state information for one or more well plans. As mentioned with respect to the example of FIG. 9, a policy network can provide for move selection (e.g., action selection) and a value network can provide for state evaluation (e.g., value of a state).

As to a neural network architecture, for the aforementioned AlphaGo, the input to the policy network is a 19×19× 48 image stack including 48 feature planes. In such a system, the first hidden layer zero pads the input into a 23×23 image, then convolves k filters of kernel size 5×5 with stride 1 with the input image and applies a rectifier nonlinearity. Each of the subsequent hidden layers 2 to 12 zero pads the respective previous hidden layer into a 21×21 image, then convolves k filters of kernel size 3×3 with stride 1, again followed by a rectifier nonlinearity. The final layer convolves 1 filter of kernel size 1×1 with stride 1, with a different bias for each position, and applies a softmax function. The match version of AlphaGo used k=192 filters. In the AlphaGo system, input to the value network is also a 19×19×48 image stack, with an additional binary feature plane describing the current colour to play. Hidden layers 2 to 11 are as those in the policy network, hidden layer 12 is an additional convolution layer, hidden layer 13 convolves 1 filter of kernel size 1×1 with stride 1, and hidden layer 14 is a fully connected linear layer with 256 rectifier units. The output layer of the AlphaGo system is a fully connected linear layer with a single tanh unit. Further information is provided in Silver et al., Mastering the Game of Go with Deep Neural Networks and Tree Search. Nature, Vol. 529, 28 Jan. 2016, p. 484, which is incorporated by reference herein.

Figure 11:
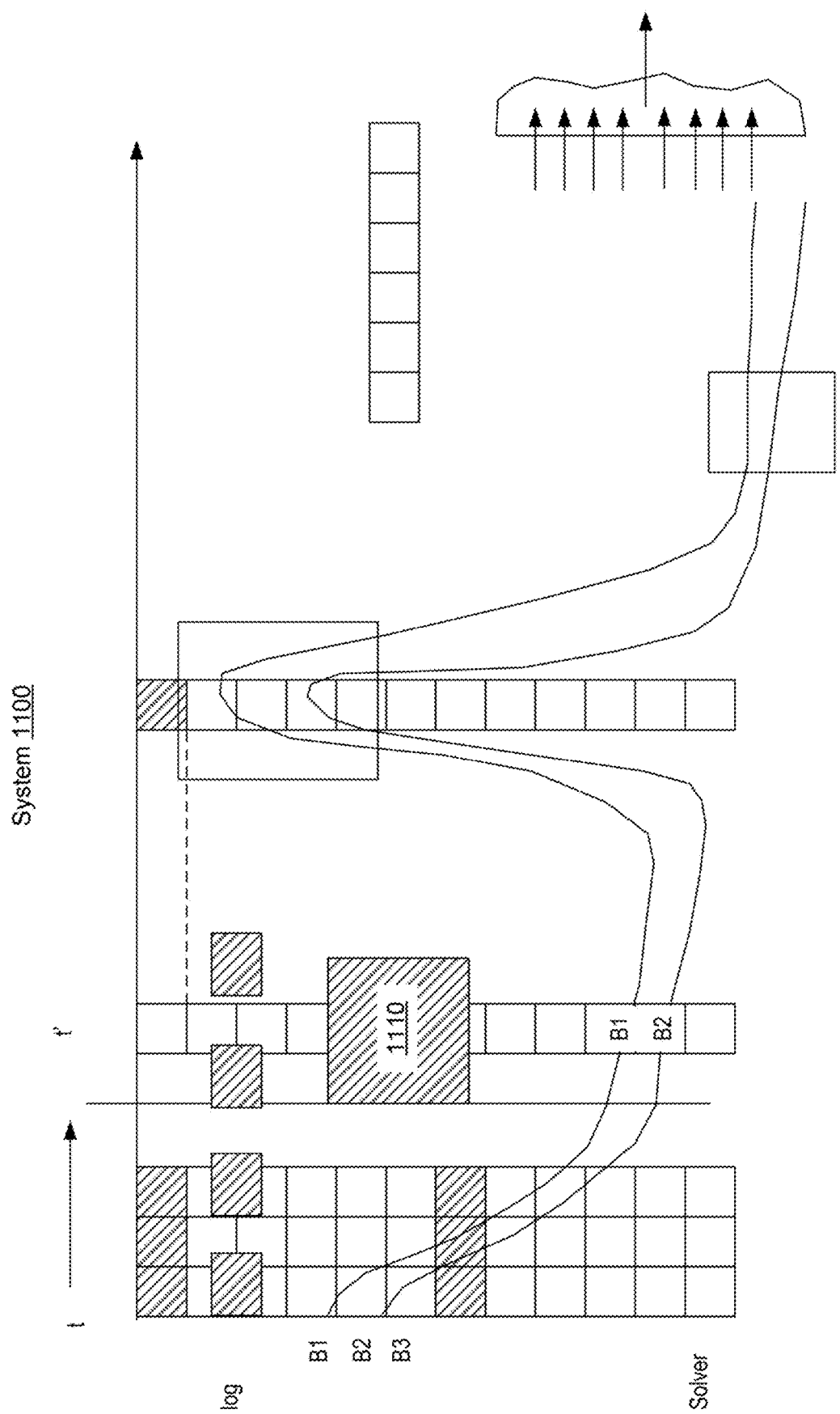
FIG. 11 illustrates an example of a policy network image stack and a value network image stack.

FIG. 11 shows a diagram of an example of a system 1100 for image-based representation of input plans. In such an example, rows can be time points in a plan (e.g., 0 up to plan horizon), columns can be state variables and cells can be state variable values at time points.

In the system 1100, as time passes, values of the state variables change and can be seen to ripple across the image. Correlation between state variables can be observed at intermediate states of the system (these correlations can be spatial, as represented by the block 1110).

In the system 1110, an image is not an image classified for visual understanding by a human or other animal that views the image, rather, the image is a construct of information that represents an operational state of equipment as may be an operational state of equipment utilized for drilling a well, completing a well, cementing a well, etc.

Figure 12:
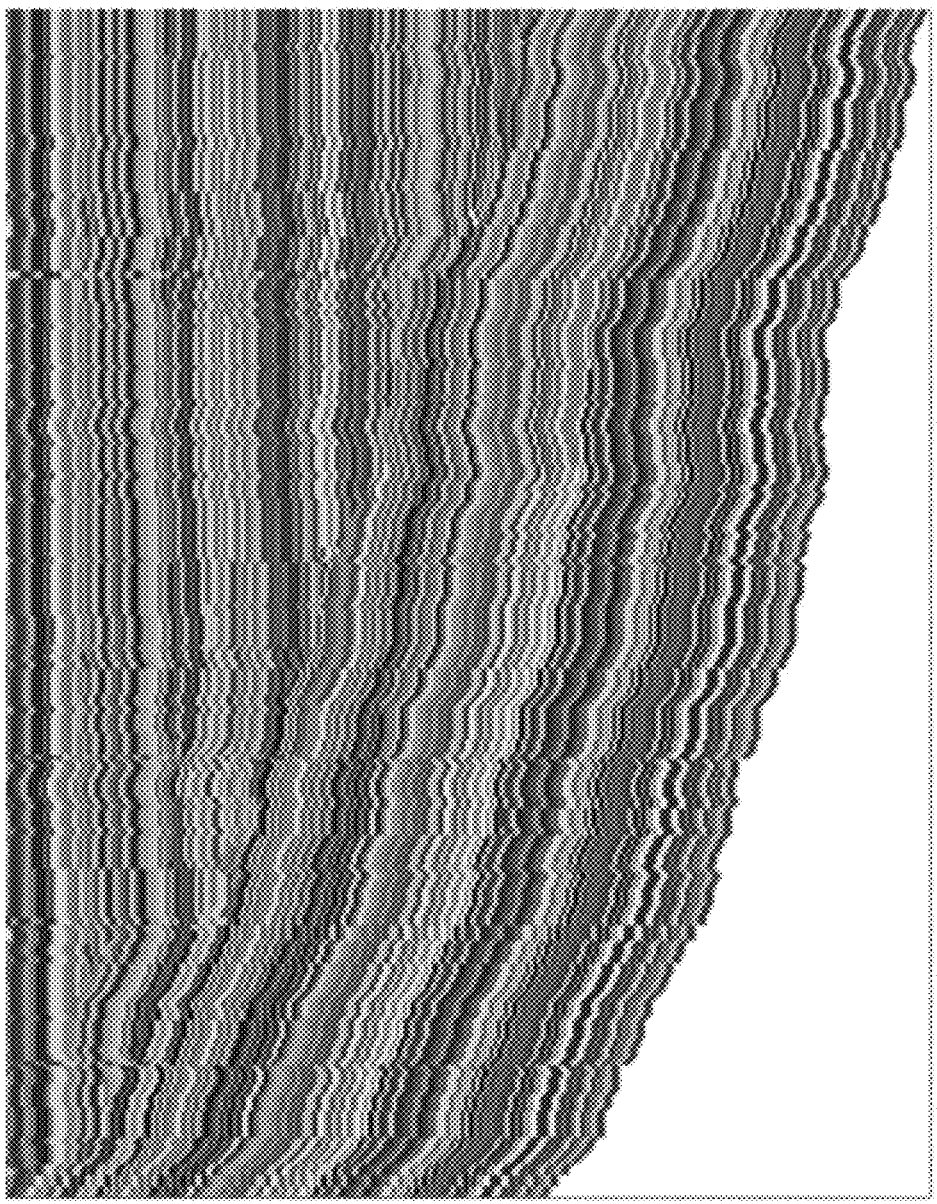
FIG. 12 illustrates an example of an image representation of plan information.
Figure 13:
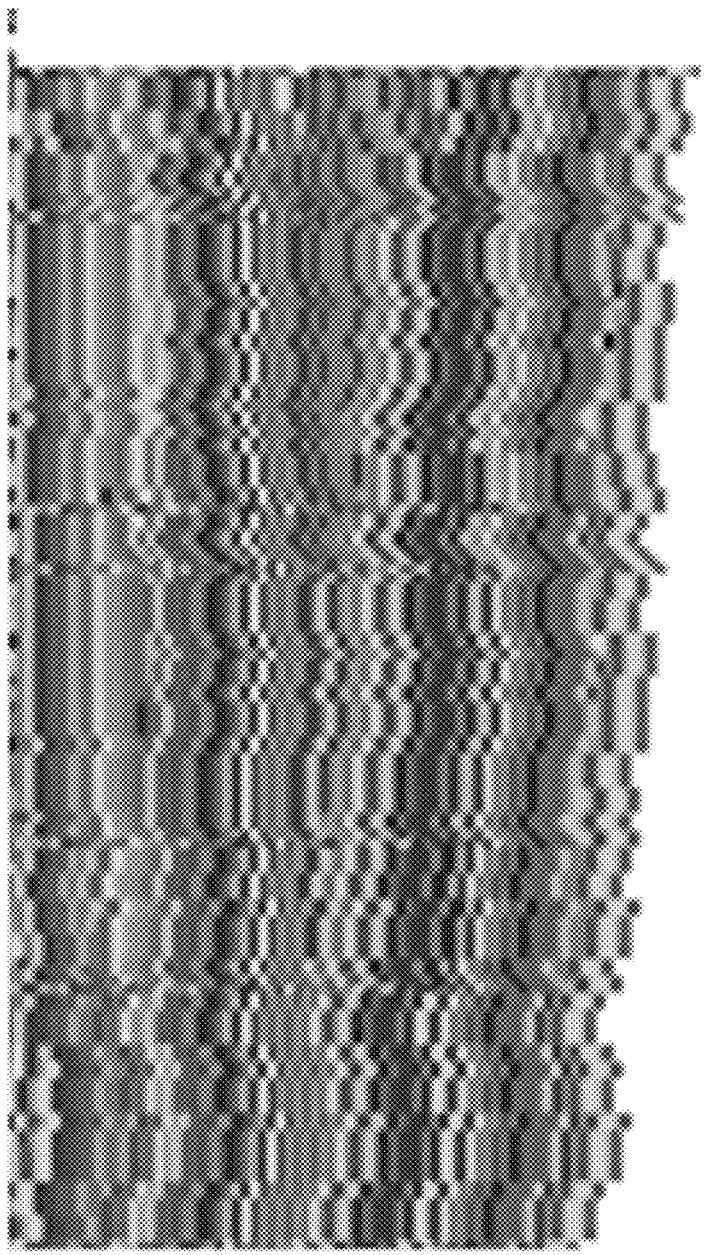
FIG. 13 illustrates an example of an image representation of plan information.

FIGS. 12 and 13 show examples of images 1200 and 1300, respectively. The image 1200 corresponds to a plan associated with the Maestro block 402 of the system 400 of FIG. 4 and the image 1300 corresponds to a mud domain plan (e.g., as associated with drilling fluid).

In FIGS. 12 and 13, the images are shown in grayscale; noting that the underlying data are color images. As such, the images of FIGS. 12 and 13 have color equivalents. For example, the images 1200 and 1300 can be color coded as follows: each column of pixels in the image represents a state, and each pixel in the column is color coding a state variable in the state; the state variables in a state (column) are listed according to their most recently added time in a plan, for example, assuming that there are two states (a,b) and (a,b,c), the first column includes two pixels in the order of (a,b), and the second column includes three pixels in the order of (c,a,b), meaning the more recently added facts are appended to the beginning of a column.

From the two images 1200 and 1300, different patterns exist that are linked to particular nature of their corresponding domains. Such representations of states can be feed into a DNN learner.

Figure 14:
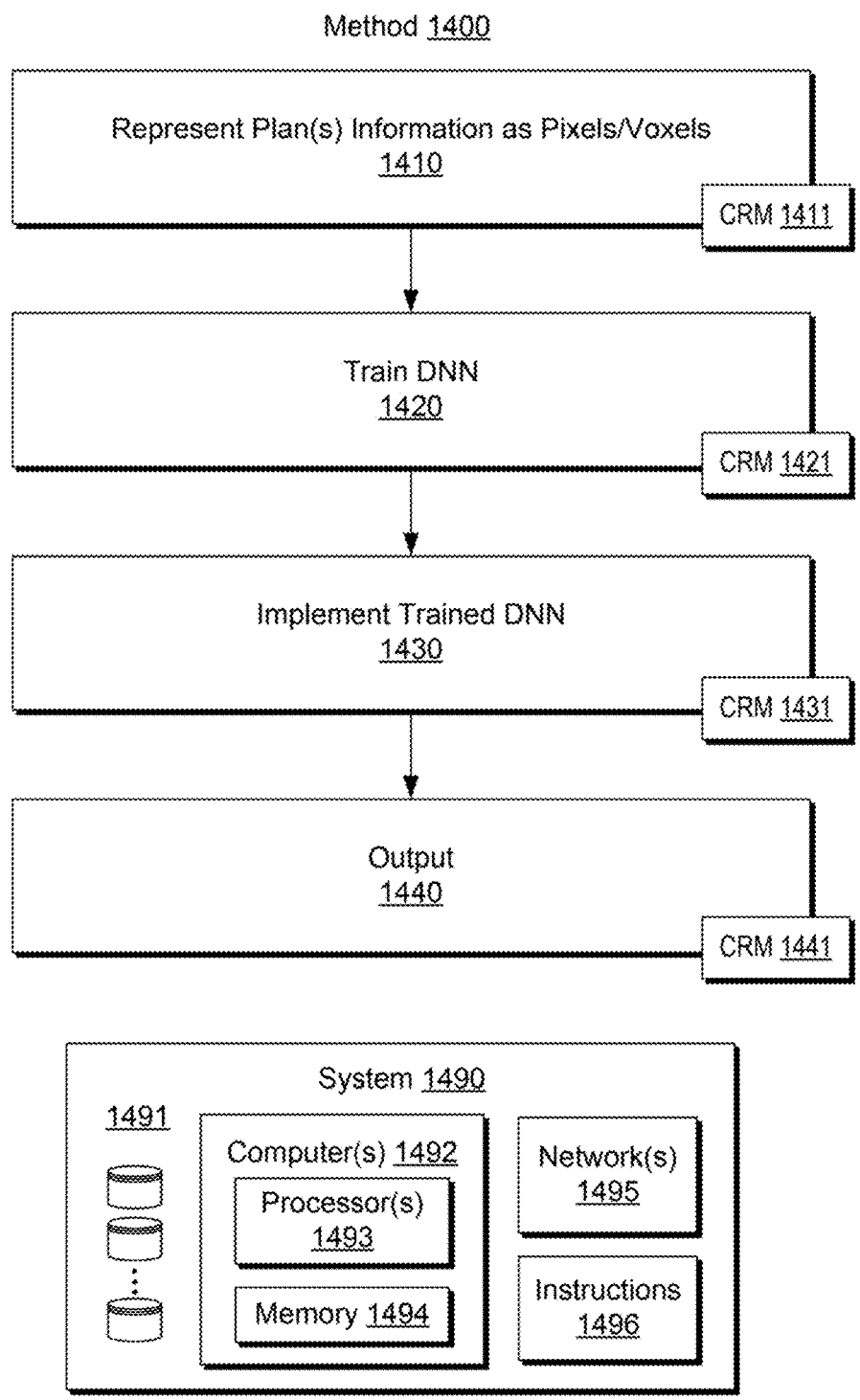
FIG. 14 illustrates an example of a method and an example of a system.

FIG. 14 shows an example of a method 1400 that includes a representation block 1410 for representing information for one or more plans as pixels and/or voxels, a train block 1420 for training a deep neural network (DNN) based at least in part on the represented information, an implementation block 1430 for implementing the trained DNN, and an output block 1440 for outputting one or more types of information (e.g., a generated plan, control signal(s), etc.).

As an example, the method 1400 can include, per the representation block 1410, representing oilfield operational plan information as pixels where the pixels include pixels that correspond to a plurality of different state variables associated with oilfield operations; per the train block 1420, training a deep neural network based at least in part on the pixels to generate a trained deep neural network; per the implementation block 1430, implementing the trained deep neural network during generation of an oilfield operational plan; and, per the output block 1440, outputting the oilfield operational plan as a digital plan that specifies at least one control action for oilfield equipment.

FIG. 14 also shows various computer-readable media (CRM) blocks 1411, 1421, 1431 and 1441 as associated with the blocks 1410, 1420, 1430 and 1440. Such blocks can include instructions that are executable by one or more processors, which can be one or more processors of a computational framework, a system, a computer, etc. A computer-readable medium can be a computer-readable storage medium that is not a signal, not a carrier wave and that is non-transitory. For example, a computer-readable medium can be a physical memory component that can store information in a digital format.

In the example of FIG. 14, a system 1490 includes one or more information storage devices 1491, one or more computers 1492, one or more networks 1495 and instructions 1496. As to the one or more computers 1492, each computer may include one or more processors (e.g., or processing cores) 1493 and memory 1494 for storing the instructions 1496, for example, executable by at least one of the one or more processors. As an example, a computer may include one or more network interfaces (e.g., wired or wireless), one or more graphics cards, a display interface (e.g., wired or wireless), etc.

As an example, a trained DNN can be considered to be a heuristic tool that can be implemented during generation of a plan, which can include during modification of a plan. As an example, a modification of a plan can include extending the plan in time and/or as to operations, etc. For example, where a plan is a well plan, the plan may be extended for production time or, for example, as to one or more completions operations that may not have been part of the plan (e.g., a prior version of the plan).

As an example, a heuristic tool can include one or more heuristic functions (e.g., one or more heuristics), which may rank one or more alternatives with respect to one or more search algorithms, for example, at individual branching steps based on available information to provide as output information to help decide which branch to follow.

As an example, a learned heuristic can play a role in directing search for a plan during plan generation. Such an approach can be utilized to determine an operation or operations, for example, in a sequence or sequences, which may be temporal or otherwise ordered (e.g., depending on flow rate, depending on drilling, depending on a completion operation, etc.).

As an example, a trained DNN can be utilized for directing search during plan generation. As an example, a planner can access a trained DNN during plan generation where the trained DNN can facilitate decision making, which can be search result-based decision making.

As an example, a trained DNN can provide an informative heuristic to guide the search of a planner during plan generation. For example, a trained DNN can be implemented as a tool that facilitates choosing between states during search. As an example, a trained DNN can help to guide one or more searches for a plan during plan generation.

As an example, a trained DNN may be implemented with a planner, additionally or alternatively to a moderately informative heuristic (e.g., one that may not be learned but rather one that may be based on a standard relaxation of constraints). In such an example, a trained DNN may be available as an option to replace a moderately informative heuristic where the trained DNN is more informative. As mentioned such a DNN may be trained via use of plan information, which may be in the form of an image composed of pixels. In such an example, the image can include spatial information such that spatial correlations can part of input. A planner may access a trained DNN to leverage an approach that includes exploiting spatial correlations in input. A method can include representing plan information as pixels (e.g., training information); and training a deep neural network based at least in part on the pixels to generate a trained deep neural network. In such an example, the method can utilize the trained deep neural network as a heuristic tool as part of a planner, for example, to facilitate searching and decision making. A planner can exploit the power of one or more DNNs for the purpose of planning.

As an example, a DNN can be used to modify a plan during execution of the plan as information is fed to the system from field operations (or other sources). Such an approach may also allow for on-going training of the DNN. In such an example, a method can include re-planning, which may re-invoke one or more heuristics, which may include relearning at that point. As an example, a DNN may be implemented in a manner that is operatively coupled to systems control, whether for planning or for on-going operations. As an example, a DNN may be implemented at a planning level and/or at a systems control level. In such an example, the DNN may be a DNN trained based on information cast in the form of an image, for example, an image made of pixels. A pixel image may be of a size and shape that may deviate from rectangle or square. A pixel image may be of a size and a shape that corresponds to information that is to be input, which may be training information to train a DNN. Where a DNN is to be implemented in a planner during plan generation, the DNN can be a DNN trained via one or more pixel images (e.g., arrangement of pixels that represent plan information).

As an example, a pixel set can be defined by a grid and, for example, by a "space" or "spaces" such as one or more of a black and white space, a grayscale space and/or a color space. Such spaces may be coded spaces where a pixel can represent a state variable in a state via space coding. A shape and/or a size of a pixel image may depend on the nature of a domain or domains.

As an example, a method can include representing plan information as pixels; training a deep neural network based at least in part on the pixels to generate a trained deep neural network; and implementing the trained deep neural network during generation of a plan. In such an example, the deep neural network can include a policy network portion and a value network portion.

As an example, a plan can be or include a well plan. As an example, plan information can include equipment information. As an example, plan information can include well trajectory information.

As an example, pixels can be arranged as a two-dimensional array of values. As an example, a deep neural network can be or include an image analysis deep neural network.

As an example, a plan can include time as a dimension. As an example, at a given time, a plan may be represented as pixels, which may be pixels of a two-dimensional image. For example, consider pixels along one dimension in the image that represent a state with each pixel color coding a state variable in the state and, for example, pixels in another dimension in the image that represent state variables in a state (e.g., where each pixel is listed according to its most recently added time in the plan).

As an example, a method can include implementing a trained deep neural network by accessing the trained deep neural network as a heuristic tool that facilitates search of a planner during generation of a plan by the planner.

As an example, a method can include representing plan information as pixels; training a deep neural network based at least in part on the pixels to generate a trained deep neural network; implementing the trained deep neural network during generation of a plan; and outputting the generated plan. Such a plan can include one or more operations that are set forth in the plan based at least in part on one or more heuristics of the trained deep neural network. As an example, a plurality of deep neural networks may be trained and implemented during planning by a planner to generate one or more plans. In such an example, at least one of the deep neural networks can be trained via information represented as pixels.

As an example, a system can include a processor; memory accessible by the processor; processor-executable instructions stored in the memory and executable to instruct the system to: represent plan information as pixels; train a deep neural network based at least in part on the pixels to generate a trained deep neural network; and implement the trained deep neural network during generation of a plan, which can include modification of an existing plan.

As an example, one or more computer-readable storage media can include processor-executable instructions to instruct a computing system to: represent plan information as pixels; train a deep neural network based at least in part on the pixels to generate a trained deep neural network; and implement the trained deep neural network during generation of a plan, which may include modification of an existing plan.

As an example, a method can include representing oilfield operational plan information as pixels where the pixels include pixels that correspond to a plurality of different state variables associated with oilfield operations; training a deep neural network based at least in part on the pixels to generate a trained deep neural network; implementing the trained deep neural network during generation of an oilfield operational plan; and outputting the oilfield operational plan as a digital plan that specifies at least one control action for oilfield equipment. In such an example, the deep neural network can include a policy network portion and a value network portion.

As an example, an oilfield operational plan can be or can include a well plan. As an example, oilfield operational plan information can be or can include equipment information. As an example, oilfield operational plan information can include well trajectory information.

As an example, pixels can be a two-dimensional array of values. In such an example, a single pixel may be a single value, a duple, a tuple, etc. As an example, a single pixel may be multivalued according to a scheme such as a color scheme (e.g., RGB, YUV, etc.). As an example, a single pixel may include an array index or indexes (e.g., (101, 85) in a 128×128 array).

As an example, a deep neural network can be or can include an image analysis deep neural network. As an example, a deep neural network can be or can include an image analysis convolution neural network.

As an example, an oilfield operational plan can include time as a dimension. As an example, an image can include time as a dimension. For example, consider states as columns and time along a row dimension where a column represents a state at a particular time of a plurality of times.

As an example, pixels can be pixels of a two-dimensional image. In such an example, pixels along one dimension in the image can represent a state (e.g., an operational state of field equipment with respect to a geologic environment, a wellbore, a trajectory, drilling fluid, etc.). As an example, in a two-dimensional image of pixels, each pixel along one dimension in the image can be coded according to a grayscale scheme and/or coded according to a color scheme. For example, where a line of pixels represents a state (e.g., along a dimension of the two-dimensional image of pixels), the individual pixels can be coded to indicate a value or values of a variable, which can be a state variable.

As an example, a method can include implementing a trained deep neural network at least in part by accessing the trained deep neural network as a heuristic tool that facilitates search of a planner during generation of an oilfield operational plan by the planner. For example, a planner can execute via a computational framework where a search may be initiated by the planner where the search may include a query (e.g., one or more search terms, etc.). In such an example, the planner may access a trained deep neural network to perform one or more searches according to the query. In such an example, the trained deep neural network can return one or more search results to the planner. As an example, a planner may plan a state as an operational state to be achieved as part of a drilling operation for a well. In such an example, the planner may act to plan a subsequent state and formulate a query based on one or more planned states to instruct a trained deep neural network to determine one or more candidate subsequent states that can possible serve as the subsequent state. In such an example, an analogy to the game "Go" may be "what my a next move?" where, in the context of the plan of the planner, the question may be "what is the next state for the plan?" where the next state may be selected from a ranking of states or a single state returned by a computational framework that implements the trained deep neural network.

As an example, a method can include receiving a digital plan by a computational framework. In such an example, the method can include, based at least in part on the digital plan and via the computational framework, rendering a graphical user interface to a display where the graphical user interface specifies at least one control action for oilfield equipment. Such a control action may be, for example, a drilling control action, a drilling fluid control action, a sensor control action, a fracturing control action, a pull-out-of-hole (POOH) control action, etc.

As an example, a system can include a processor; memory accessible by the processor; processor-executable instructions stored in the memory and executable to instruct the system to: represent oilfield plan information as pixels where the pixels include pixels that correspond to a plurality of different state variables associated with oilfield operations; train a deep neural network based at least in part on the pixels to generate a trained deep neural network; and implement the trained deep neural network during generation of an oilfield operational plan that specifies at least one control action for oilfield equipment. In such an example, pixels along one dimension in the image can represent a state.

As an example, one or more computer-readable storage media can include processor-executable instructions to instruct a computing system to: represent oilfield plan information as pixels where the pixels include pixels that correspond to a plurality of different state variables associated with oilfield operations; train a deep neural network based at least in part on the pixels to generate a trained deep neural network; and implement the trained deep neural network during generation of an oilfield operational plan that specifies at least one control action for oilfield equipment. In such an example, pixels along one dimension in the image can represent a state.

As an example, a method may be implemented in part using computer-readable media (CRM), for example, as a module, a block, etc. that include information such as instructions suitable for execution by one or more processors (or processor cores) to instruct a computing device or system to perform one or more actions. As an example, a single medium may be configured with instructions to allow for, at least in part, performance of various actions of a method. As an example, a computer-readable medium (CRM) may be a computer-readable storage medium (e.g., a non-transitory medium) that is not a carrier wave.

According to an embodiment, one or more computer-readable media may include computer-executable instructions to instruct a computing system to output information for controlling a process. For example, such instructions may provide for output to sensing process, an injection process, drilling process, an extraction process, an extrusion process, a pumping process, a heating process, etc.

Figure 15:
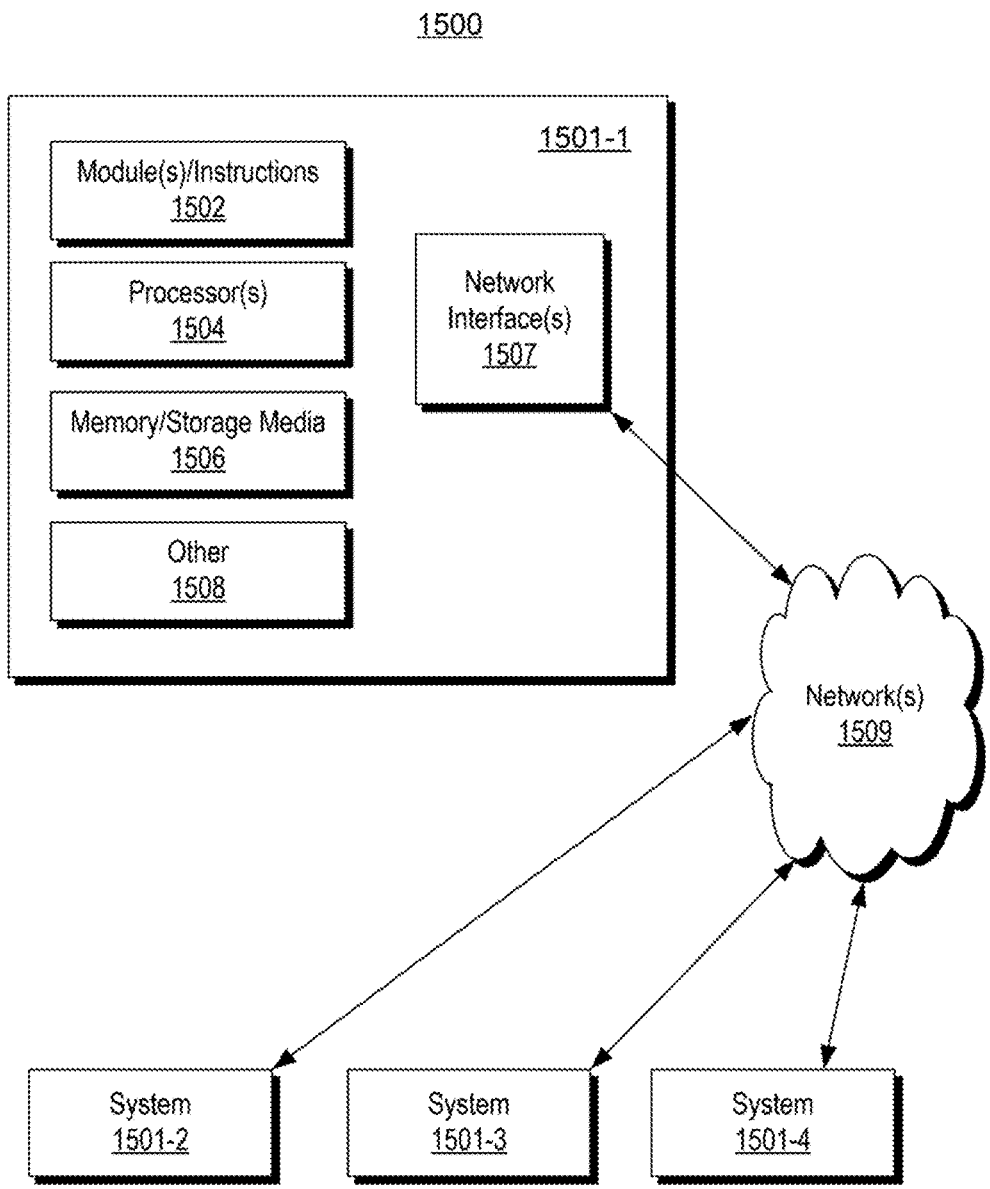
FIG. 15 illustrates an example of computing system.

In some embodiments, a method or methods may be executed by a computing system. FIG. 15 shows an example of a system 1500 that can include one or more computing systems 1501-1, 1501-2, 1501-3 and 1501-4, which may be operatively coupled via one or more networks 1509, which may include wired and/or wireless networks.

As an example, a system can include an individual computer system or an arrangement of distributed computer systems. In the example of FIG. 15, the computer system 1501-1 can include one or more modules 1502, which may be or include processor-executable instructions, for example, executable to perform various tasks (e.g., receiving information, requesting information, processing information, simulation, outputting information, etc.).

As an example, a module may be executed independently, or in coordination with, one or more processors 1504, which is (or are) operatively coupled to one or more storage media 1506 (e.g., via wire, wirelessly, etc.). As an example, one or more of the one or more processors 1504 can be operatively coupled to at least one of one or more network interface 1507. In such an example, the computer system 1501-1 can transmit and/or receive information, for example, via the one or more networks 1509 (e.g., consider one or more of the Internet, a private network, a cellular network, a satellite network, etc.).

As an example, the computer system 1501-1 may receive from and/or transmit information to one or more other devices, which may be or include, for example, one or more of the computer systems 1501-2, etc. A device may be located in a physical location that differs from that of the computer system 1501-1. As an example, a location may be, for example, a processing facility location, a data center location (e.g., server farm, etc.), a rig location, a wellsite location, a downhole location, etc.

As an example, a processor may be or include a microprocessor, microcontroller, processor module or subsystem, programmable integrated circuit, programmable gate array, or another control or computing device.

As an example, the storage media 1506 may be implemented as one or more computer-readable or machine-readable storage media. As an example, storage may be distributed within and/or across multiple internal and/or external enclosures of a computing system and/or additional computing systems.

As an example, a storage medium or storage media may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLUERAY® disks, or other types of optical storage, or other types of storage devices.

As an example, a storage medium or media may be located in a machine running machine-readable instructions, or located at a remote site from which machine-readable instructions may be downloaded over a network for execution.

As an example, various components of a system such as, for example, a computer system, may be implemented in hardware, software, or a combination of both hardware and software (e.g., including firmware), including one or more signal processing and/or application specific integrated circuits.

As an example, a system may include a processing apparatus that may be or include a general purpose processors or application specific chips (e.g., or chipsets), such as ASICs, FPGAs, PLDs, or other appropriate devices.

Figure 16:
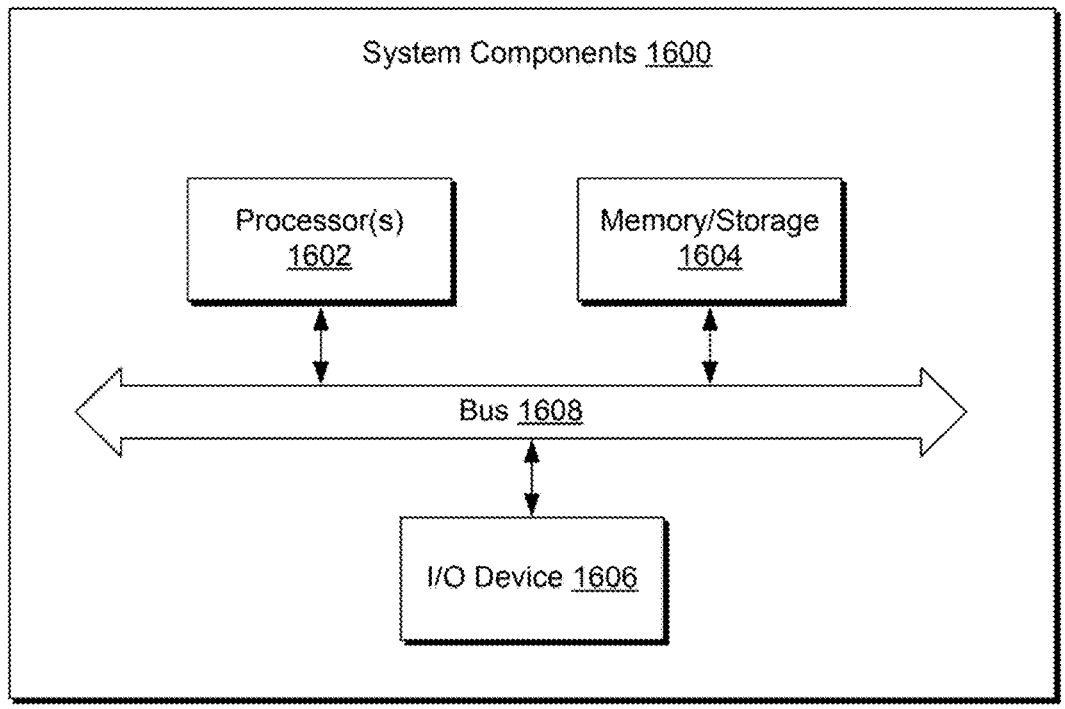
FIG. 16 illustrates example components of a system and a networked system.
Figure 16:
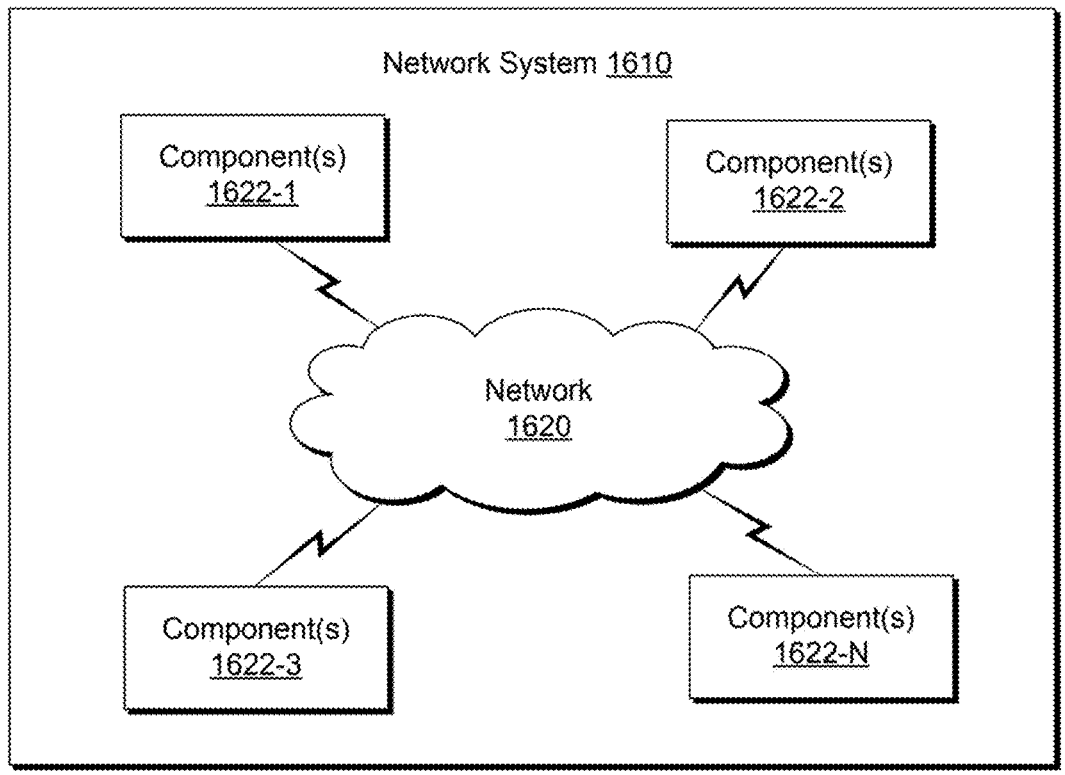

FIG. 16 shows components of a computing system 1600 and a networked system 1610. The system 1600 includes one or more processors 1602, memory and/or storage components 1604, one or more input and/or output devices 1606 and a bus 1608. According to an embodiment, instructions may be stored in one or more computer-readable media (e.g., memory/storage components 1604). Such instructions may be read by one or more processors (e.g., the processor(s) 1602) via a communication bus (e.g., the bus 1608), which may be wired or wireless. The one or more processors may execute such instructions to implement (wholly or in part) one or more attributes (e.g., as part of a method). A user may view output from and interact with a process via an I/O device (e.g., the device 1606). According to an embodiment, a computer-readable medium may be a storage component such as a physical memory storage device, for example, a chip, a chip on a package, a memory card, etc.

According to an embodiment, components may be distributed, such as in the network system 1610. The network system 1610 includes components 1622-1, 1622-2, 1622-3, . . . 1622-N. For example, the components 1622-1 may include the processor(s) 1602 while the component(s) 1622-3 may include memory accessible by the processor(s) 1602. Further, the component(s) 1622-2 may include an I/O device for display and optionally interaction with a method.

The network may be or include the Internet, an intranet, a cellular network, a satellite network, etc.

As an example, a device may be a mobile device that includes one or more network interfaces for communication of information. For example, a mobile device may include a wireless network interface (e.g., operable via IEEE 802.11, ETSI GSM, BLUETOOTH®, satellite, etc.). As an example, a mobile device may include components such as a main processor, memory, a display, display graphics circuitry (e.g., optionally including touch and gesture circuitry), a SIM slot, audio/video circuitry, motion processing circuitry (e.g., accelerometer, gyroscope), wireless LAN circuitry, smart card circuitry, transmitter circuitry, GPS circuitry, and a battery. As an example, a mobile device may be configured as a cell phone, a tablet, etc. As an example, a method may be implemented (e.g., wholly or in part) using a mobile device. As an example, a system may include one or more mobile devices.

As an example, a system may be a distributed environment, for example, a so-called "cloud" environment where various devices, components, etc. interact for purposes of data storage, communications, computing, etc. As an example, a device or a system may include one or more components for communication of information via one or more of the Internet (e.g., where communication occurs via one or more Internet protocols), a cellular network, a satellite network, etc. As an example, a method may be implemented in a distributed environment (e.g., wholly or in part as a cloud-based service).

As an example, information may be input from a display (e.g., consider a touchscreen), output to a display or both. As an example, information may be output to a projector, a laser device, a printer, etc. such that the information may be viewed. As an example, information may be output stereographically or holographically. As to a printer, consider a 2D or a 3D printer. As an example, a 3D printer may include one or more substances that can be output to construct a 3D object. For example, data may be provided to a 3D printer to construct a 3D representation of a subterranean formation. As an example, layers may be constructed in 3D (e.g., horizons, etc.), geobodies constructed in 3D, etc. As an example, holes, fractures, etc., may be constructed in 3D (e.g., as positive structures, as negative structures, etc.).

Although only a few examples have been described in detail above, those skilled in the art will readily appreciate that many modifications are possible in the examples. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words "means for" together with an associated function.

What is claimed is:

1. A method comprising:
   receiving an oilfield operational plan and converting the oilfield operational plan into pixel-grids that are interpreted as images;

inputting the pixel-grids to an image analysis convolution neural network to execute an image interpretation process;

determining a current state of the oilfield operational plan based on the image interpretation process; and determining a next state of the oilfield operational plan, where the next state is a desirable state that is achievable via at least one action, wherein at least one control signal is outputted to oilfield equipment to execute the at least one action to achieve the next state.

2. The method of claim 1, wherein pixel-grids comprise pixels that correspond to a plurality of different state variables associated with oilfield operations.

3. The method of claim 2, wherein the pixels comprise a two-dimensional array of values.

4. The method of claim 2, wherein a line of the pixels along an image dimension of the images represents instances of state variables that collectively define an oilfield operational state.

5. The method of claim 1, wherein the oilfield operational plan comprises at least one of: a well plan, equipment information, and well trajectory information.

6. The method of claim 1, wherein the image analysis convolution neural network is part of a deep neural network.

7. The method of claim 6, wherein convolution and nonlinearity techniques are implemented for finding spatially correlated features in the images.

8. The method of claim 7, further including inputting the spatially correlated features to the deep neural network to generate a trained deep neural network.

9. The method of claim 8, wherein the trained deep neural network is implemented to generate the oilfield operational plan.

10. A system comprising:
a processor;
memory accessible by the processor;
processor-executable instructions stored in the memory and executable to instruct the system to:
receive an oilfield operational plan and convert the oilfield operational plan into pixel-grids that are interpreted as images;
input the pixel-grids to an image analysis convolution neural network to execute an image interpretation process;
determine a current state of the oilfield operational plan based on the image interpretation process; and
determine a next state of the oilfield operational plan, where the next state is a desirable state that is achievable via at least one action, wherein at least one control signal is outputted to oilfield equipment to execute the at least one action to achieve the next state.

11. The system of claim 10, wherein pixel-grids comprise pixels that correspond to a plurality of different state variables associated with oilfield operations.

12. The system of claim 11, wherein the pixels comprise a two-dimensional array of values.

13. The system of claim 11, wherein a line of the pixels along an image dimension of the images represents instances of state variables that collectively define an oilfield operational state.

14. The system of claim 10, wherein the oilfield operational plan comprises at least one of: a well plan, equipment information, and well trajectory information.

15. The system of claim 10, wherein the image analysis convolution neural network is part of a deep neural network.

16. The system of claim 15, wherein convolution and nonlinearity techniques are implemented for finding spatially correlated features in the images.

17. The system of claim 16, further including inputting the spatially correlated features to the deep neural network to generate a trained deep neural network.

18. The system of claim 17, wherein the trained deep neural network is implemented to generate the oilfield operational plan.

19. A non-transitory computer-readable storage medium storing instructions that when executed by a computer, which includes a processor performs a method, the method comprising:
receiving an oilfield operational plan and converting the oilfield operational plan into pixel-grids that are interpreted as images;
inputting the pixel-grids to an image analysis convolution neural network to execute an image interpretation process;
determining a current state of the oilfield operational plan based on the image interpretation process; and
determining a next state of the oilfield operational plan, where the next state is a desirable state that is achievable via at least one action, wherein at least one control signal is outputted to oilfield equipment to execute the at least one action to achieve the next state.

20. The non-transitory computer-readable storage medium of claim 19, wherein pixel-grids comprise pixels that correspond to a plurality of different state variables associated with oilfield operations.

* * * * *